(12) United States Patent
Han et al.

(10) Patent No.: US 10,079,245 B2
(45) Date of Patent: Sep. 18, 2018

(54) SEMICONDUCTOR DEVICE AND METHOD FOR FABRICATING SAME

(71) Applicants: Hauk Han, Hawseong-si (KR);
Je-Hyeon Park, Suwon-si (KR);
Kihyun Yoon, Seongnam-si (KR);
Changwon Lee, Hawseong-si (KR);
HyunSeok Lim, Seongnam-si (KR);
Jooyeon Ha, Seoul (KR)

(72) Inventors: Hauk Han, Hawseong-si (KR);
Je-Hyeon Park, Suwon-si (KR);
Kihyun Yoon, Seongnam-si (KR);
Changwon Lee, Hawseong-si (KR);
HyunSeok Lim, Seongnam-si (KR);
Jooyeon Ha, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 24 days.

(21) Appl. No.: 15/249,090

(22) Filed: Aug. 26, 2016

(65) Prior Publication Data
US 2017/0062470 A1    Mar. 2, 2017

(30) Foreign Application Priority Data
Aug. 28, 2015   (KR) .......................... 10-2015-0121910

(51) Int. Cl.
*H01L 23/52*      (2006.01)
*H01L 27/11582*   (2017.01)
(Continued)

(52) U.S. Cl.
CPC ...... *H01L 27/11582* (2013.01); *H01L 23/535* (2013.01); *H01L 27/1157* (2013.01)

(58) Field of Classification Search
CPC ........................... H01L 23/525; H01L 21/326
See application file for complete search history.

(56) References Cited

U.S. PATENT DOCUMENTS

| 6,524,956 | B1 * | 2/2003 | Tian ................ H01L 21/28556 257/E21.17 |
| 7,679,133 | B2 | 3/2010 | Son et al. |

(Continued)

FOREIGN PATENT DOCUMENTS

| JP | 2013-032575 | 2/2013 |
| KR | 10-2004-0087406 | 10/2004 |

(Continued)

*Primary Examiner* — Asok K Sarkar
*Assistant Examiner* — Dmitriy Yemelyanov
(74) *Attorney, Agent, or Firm* — Muir Patent Law, PLLC

(57) ABSTRACT

A semiconductor device includes a lower structure including a lower conductor, an upper structure having an opening exposing the lower conductor on the lower structure, and a connection structure filling the opening and connected to the lower conductor. The connection structure includes a first tungsten layer covering an inner surface of the opening and defining a recess region in the opening, and a second tungsten layer filling the recess region on the first tungsten layer. A grain size of the second tungsten layer in an upper portion of the connection structure is greater than a grain size of the second tungsten layer in a lower portion of the connection structure.

20 Claims, 38 Drawing Sheets

(51) Int. Cl.
*H01L 27/1157* (2017.01)
*H01L 23/535* (2006.01)

(56) References Cited

U.S. PATENT DOCUMENTS

| | | | |
|---|---|---|---|
| 8,553,466 | B2 | 10/2013 | Han et al. |
| 8,559,235 | B2 | 10/2013 | Yoon et al. |
| 8,654,587 | B2 | 2/2014 | Yoon et al. |
| 2002/0168812 | A1 | 11/2002 | Oda et al. |
| 2003/0232496 | A1* | 12/2003 | Koo ............... H01L 21/28556 438/626 |
| 2004/0082167 | A1 | 4/2004 | Seo et al. |
| 2005/0042829 | A1* | 2/2005 | Kim ............... H01L 21/28556 438/268 |
| 2008/0315422 | A1 | 12/2008 | Boyd et al. |
| 2009/0026618 | A1* | 1/2009 | Kim ............... H01L 21/76843 257/751 |
| 2009/0275197 | A1* | 11/2009 | Kariya ............ H01L 21/28556 438/656 |
| 2010/0068881 | A1 | 3/2010 | Kang et al. |
| 2010/0203699 | A1* | 8/2010 | Tokashiki ......... H01L 21/31116 438/381 |
| 2010/0240212 | A1 | 9/2010 | Takahashi |
| 2011/0233648 | A1 | 9/2011 | Seol et al. |
| 2011/0260239 | A1* | 10/2011 | Oyu ............... H01L 29/4236 257/330 |
| 2012/0329224 | A1* | 12/2012 | Kong ............... H01L 21/0332 438/268 |
| 2013/0171822 | A1 | 7/2013 | Chandrashekar et al. |
| 2015/0050807 | A1 | 2/2015 | Wu et al. |
| 2015/0060992 | A1 | 3/2015 | Taekyung et al. |
| 2015/0137259 | A1 | 5/2015 | Han et al. |

FOREIGN PATENT DOCUMENTS

| | | |
|---|---|---|
| KR | 10-2005-0035768 | 4/2005 |
| KR | 10-2011-0075390 | 7/2011 |

\* cited by examiner

SEMICONDUCTOR DEVICE AND METHOD FOR FABRICATING SAME

CROSS-REFERENCE TO RELATED APPLICATION

This U.S. non-provisional patent application claims priority under 35 U.S.C. § 119 to Korean Patent Application No. 10-2015-0121910, filed on Aug. 28, 2015, in the Korean Intellectual Property Office, the disclosure of which is hereby incorporated by reference in its entirety.

BACKGROUND

Exemplary implementations of the subject matter disclosed herein relate to semiconductor devices and methods for fabricating the same. More particularly, exemplary implementations relate to three-dimensional (3D) semiconductor devices with improved reliability and methods for fabricating the same.

Semiconductor devices are widely used in the electronics industry because of their small sizes, multi-functional characteristics, and/or low fabrication costs. A semiconductor device may include various tiny electronic elements (e.g., a MOS transistor, a resistor, a capacitor, and/or an interconnection). The tiny electronic elements may be electrically connected to each other through interconnections and/or contact plugs.

However, the demand for highly-integrated and/or high-speed semiconductor devices has led to distances between interconnections being reduced and aspect ratios of contact plugs being increased. Thus, research has been conducted into processes capable of fabricating highly-integrated semiconductor devices.

SUMMARY

Exemplary implementations of the disclosed subject matter may provide semiconductor devices capable of improving reliability.

Exemplary implementations of the disclosed subject matter may also provide methods for fabricating a semiconductor device capable of improving reliability.

In one exemplary implementation, a semiconductor device may include a lower structure including a lower conductor, an upper structure disposed on the lower structure and having an opening exposing the lower conductor, and a connection structure filling the opening and connected to the lower conductor. The connection structure may include a first tungsten layer covering an inner surface of the opening and defining a recess region in the opening, and a second tungsten layer filling the recess region on the first tungsten layer. A grain size of the second tungsten layer in an upper portion of the connection structure may be greater than a grain size of the second tungsten layer in a lower portion of the connection structure.

In some exemplary implementations, a mean grain size of the second tungsten layer may be greater than a mean grain size of the first tungsten layer.

In other exemplary implementations, the connection structure may include a first interface formed by grains of the first tungsten layer and grains of the second tungsten layer, and a second interface formed by grains of the second tungsten layer in a central region of the connection structure.

In yet other exemplary implementations, the connection structure may have a linear shape extending in one direction, and the first and second interfaces may extend in parallel to the connection structure.

In another exemplary implementation, a semiconductor device may include stack structures extending in one direction on a substrate and spaced apart from each other, each of the stack structures comprising vertically stacked electrodes, vertical structures penetrating the stack structures, a common source line structure disposed between the stack structures adjacent to each other and spaced apart from the vertical structures, and insulating spacers disposed between the common source line structure and the stack structures. The common source line structure may extend in parallel to the electrodes. The common source line structure may include a first tungsten layer covering the insulating spacers and defining a recess region, and a second tungsten layer filling the recess region on the first tungsten layer. A grain size of the second tungsten layer in an upper portion of the common source line structure may be greater than a grain size of the second tungsten layer in a lower portion of the common source line structure.

In yet another exemplary implementation, a method for fabricating a semiconductor device may include forming an upper structure having an opening exposing a lower conductor, depositing a first tungsten layer covering an inner surface of the opening and defining a recess region in the opening, performing a surface treatment process on a portion of the first tungsten layer, the first tungsten layer having a first surface treated by the surface treatment process in an upper region of the opening and a second surface not treated by the surface treatment process in a lower region of the opening, and depositing a second tungsten layer filling the recess region. Sizes of tungsten grains grown from the first surface of the first tungsten layer may be greater than sizes of tungsten grains grown from the second surface of the first tungsten layer.

BRIEF DESCRIPTION OF THE DRAWINGS

The exemplary implementations will become more apparent in view of the attached drawings and accompanying detailed description.

DETAILED DESCRIPTION

Figure 1:
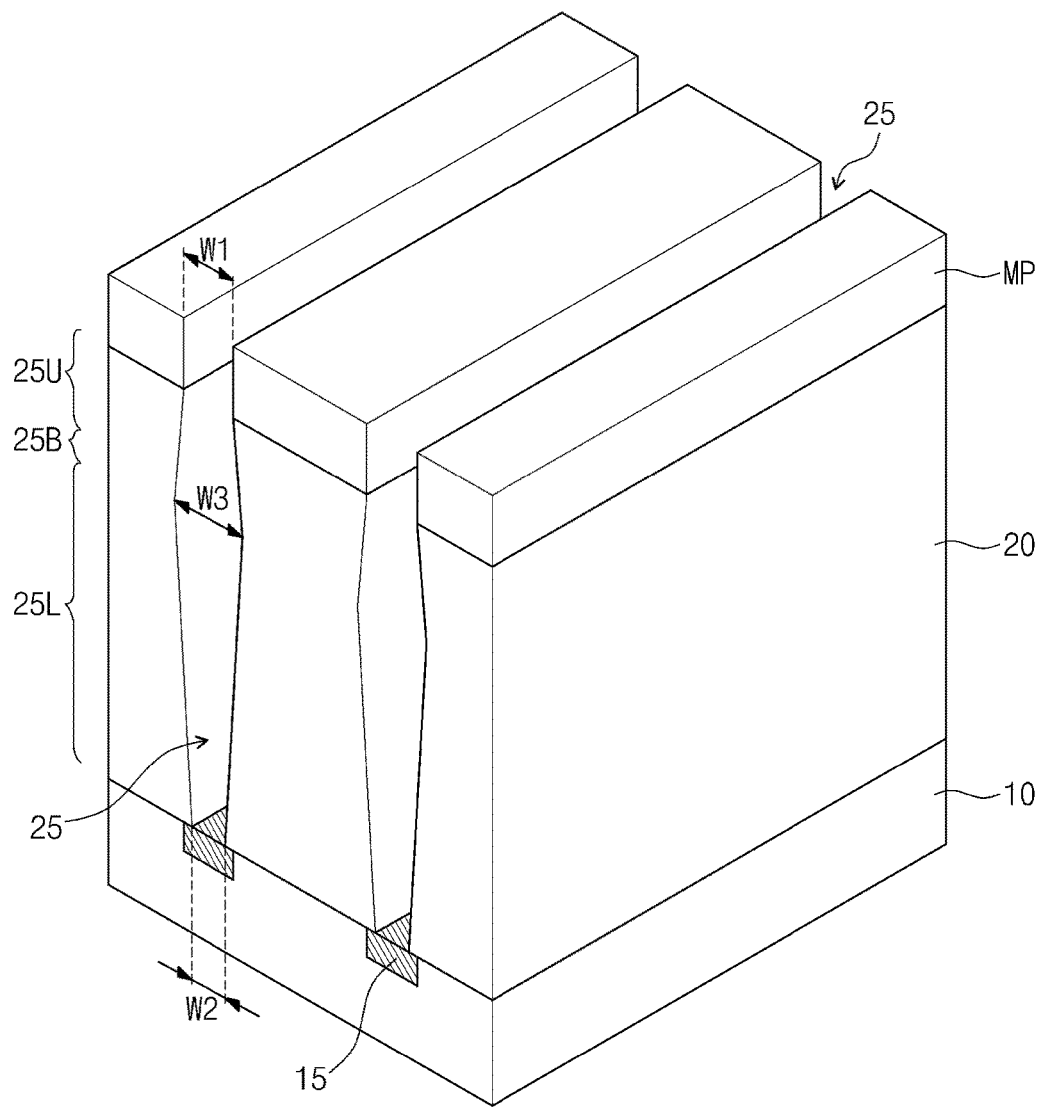
FIGS. 1 to 7 are views illustrating a method for fabricating a semiconductor device according to some exemplary implementations of the disclosed subject matter.

The exemplary implementations of the disclosed subject matter will now be described more fully hereinafter with reference to the accompanying drawings, in which exemplary implementations of the disclosed subject matter are shown. The advantages and features of the exemplary implementations and methods of achieving them will be apparent from the following description s with reference to the accompanying drawings. It should be noted, however, that the exemplary implementations are not limited to the following described examples, and may be implemented in various forms. Accordingly, the exemplary implementations are provided only to disclose the herein described subject matter and let those skilled in the art know the category of the subject matter. In the drawings, exemplary implementations are not limited to the specific examples provided herein and are exaggerated for clarity. The same reference numerals or the same reference designators denote the same elements throughout the specification.

The terminology used herein is for the purpose of describing particular exemplary implementations only and is not intended to limit the exemplary implementations. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Similarly, it will be understood that when an element such as a layer, region or substrate is referred to as being "on" another element, it can be directly on the other element or intervening elements may be present. In contrast, the term "directly" means that there are no intervening elements.

Moreover, exemplary implementations are described herein with reference to cross-sectional views and/or plan views that are idealized exemplary views. In the drawings, the thicknesses of layers and regions are exaggerated for clarity. Accordingly, variations from the shapes of the illustrations as a result, for example, of manufacturing techniques and/or tolerances, are to be expected. Thus, exemplary implementations should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary implementations.

Hereinafter, exemplary implementations will be described in detail with reference to the drawings.

Figure 8A:
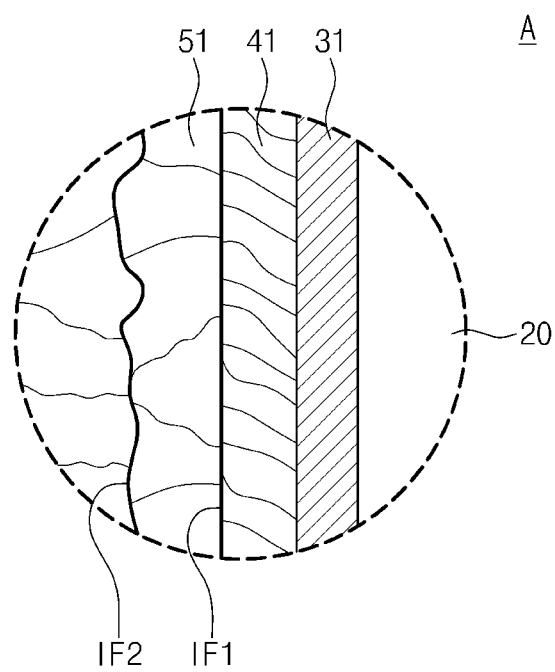
FIG. 8A is an enlarged view of a portion 'A' of FIG. 7.
Figure 8B:
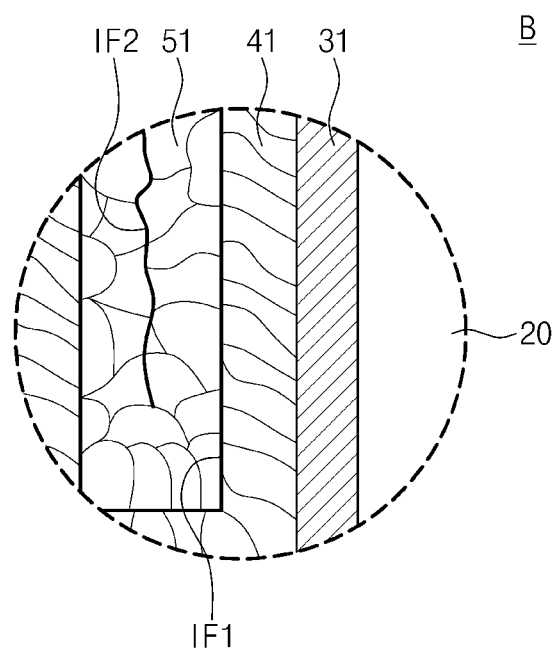
FIGS. 8B and 8C are enlarged views of a portion 'B' of FIG. 7.
Figure 8C:
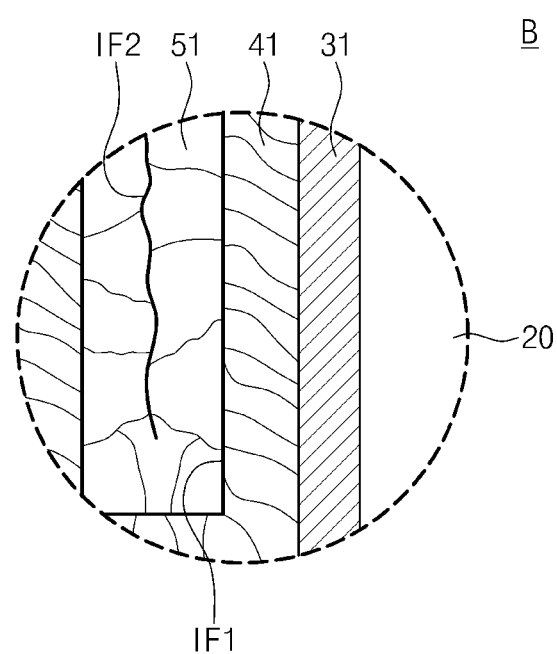
Figure 9:
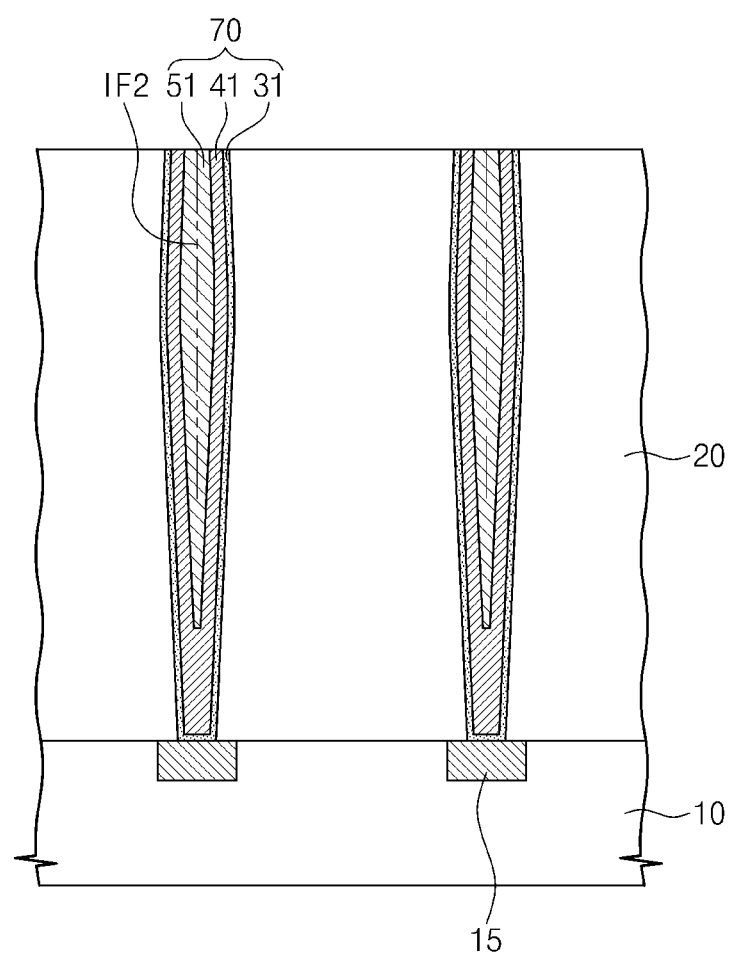
FIG. 9 is a cross-sectional view illustrating a method for fabricating a semiconductor device according to some exemplary implementations of the disclosed subject matter.

FIGS. 1 to 7 are views illustrating a method for fabricating a semiconductor device according to some exemplary implementations. FIG. 8A is an enlarged view of a portion 'A' of FIG. 7. FIGS. 8B and 8C are enlarged views of a portion 'B' of FIG. 7. FIG. 9 is a cross-sectional view illustrating a method for fabricating a semiconductor device according to some exemplary implementations.

As shown in FIG. 1, an upper structure 20 having an opening 25 may be formed on a lower structure 10 including a lower conductor 15.

The lower structure 10 may include a semiconductor substrate, semiconductor components (not shown; e.g., memory elements, MOS transistors, a capacitor, and/or a resistor) formed on the semiconductor substrate, and one or more insulating layers covering the semiconductor components. The semiconductor components may be electrically connected to the lower conductor 15. For example, the lower conductor 15 may be a dopant region, an interconnection, or a contact plug.

The upper structure 20 may include a semiconductor layer, a plurality of insulating layers, and/or a plurality of conductive layers. The opening 25 may penetrate the upper structure 20 to expose the lower conductor 15. The opening 25 may be a hole or a trench extending in one direction. The opening 25 may have a high aspect ratio of about 5:1 to about 30:1.

Forming the opening 25 may include forming a mask pattern MP having opening on the upper structure 20, and anisotropically etching the upper structure 20 using the mask pattern MP as an etch mask to expose a portion of the lower conductor 15.

An upper end of the opening 25 may have a first width W1. The first width W1 may be substantially equal to a width of the opening of the mask pattern MP. A lower end of the opening 25 may have a second width W2 smaller than the first width W1.

The opening 25 may include an upper region 25U having a negatively sloped sidewall and a lower region 25L having a positively sloped sidewall, or vice versa. Thus, opposite sidewall surfaces have, respectively, negative slope to positive slope and positive slope to negative slope sidewall surfaces. A bowing region 25B can be provided between the upper region 25U and the lower region 25L. The opening 25 may have a third width W3 in the bowing region 25B. The third width W3 may be greater than the first width W1 and the second width W2. The third width W3 may correspond to the maximum width of the opening 25. A sidewall of the opening 25 may be rounded in the bowing region 25B. A vertical length of the lower region 25L having the positively sloped sidewall may be greater than about a half of a vertical length of the opening 25. Here, the vertical length of the opening 25 may correspond to a vertical distance from a top surface of the lower structure 10 to a top surface of the upper structure 20 (i.e., a thickness of the upper structure 20).

After the formation of the opening 25, the mask pattern MP may be removed to expose the top surface of the upper structure 20.

Figure 2:
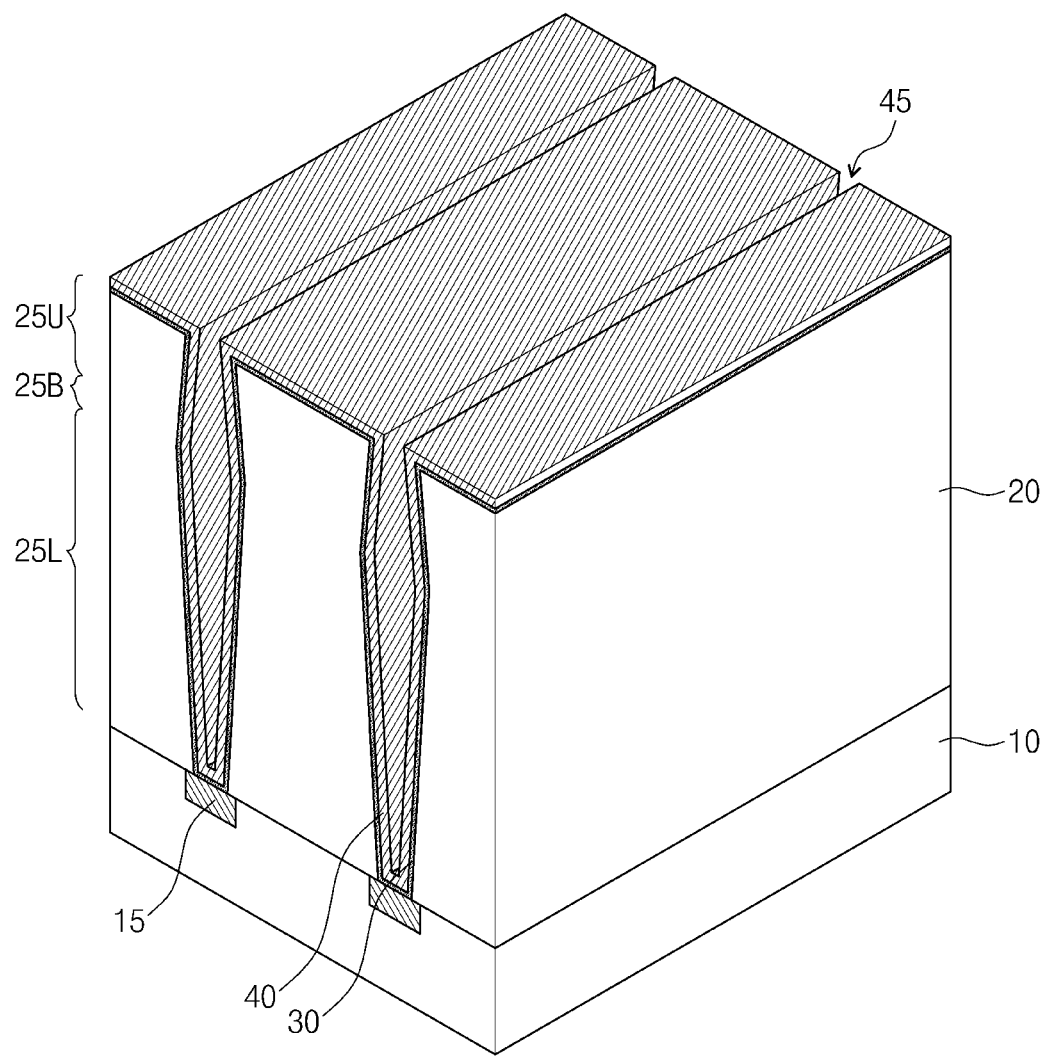

As shown in FIG. 2, a barrier metal layer 30 and a first tungsten layer 40 may be sequentially formed in opening 25.

The barrier metal layer 30 may be uniformly deposited on an inner surface of the opening 25 and the top surface of the upper structure 20. In other words, the barrier metal layer 30 may have a substantially uniform thickness. The barrier metal layer 30 may be formed of a material capable of preventing a metal material formed in the opening 25 from being diffused into the upper structure 20. For example, the barrier metal layer 30 may include at least one of tantalum (Ta), tantalum nitride (TaN), tantalum-silicon nitride (TaSiN), titanium (Ti), titanium nitride (TiN), titanium-silicon nitride (TiSiN), or tungsten nitride (WN). The barrier metal layer 30 may be formed using a chemical vapor deposition (CVD) method, an atomic layer deposition (ALD) method, or a physical vapor deposition (PVD) method (e.g., a sputtering method). In some exemplary implementations, the barrier metal layer 30 may be formed of titanium nitride (TiN).

The barrier metal layer 30 may have uniform nucleation sites on its surface, and tungsten grains may be grown from the nucleation sites. As the nucleation sites increase, sizes of the tungsten grains may be reduced.

The first tungsten layer 40 may be deposited on the surface of the barrier metal layer 30. The first tungsten layer 40 may be deposited using a thermal CVD method, a plasma-enhanced CVD method, a physical CVD method, or an ALD method. In some exemplary implementations, the first tungsten layer 40 may be formed by a CVD method using a process gas including tungsten hexafluoride ($WF_6$) and silane ($SiH_4$; or hydrogen ($H_2$)).

When the first tungsten layer 40 is deposited on the surface of the barrier metal layer 30, tungsten grains may be grown from the surface of the barrier metal layer 30. The tungsten grains may be grown in a direction substantially perpendicular to the sidewall of the opening 25. In other words, the tungsten grains may be laterally grown.

The first tungsten layer 40 may define a recess region 45 while being deposited on the surface of the barrier metal layer 30. The recess region 45 may have sidewalls facing each other and a bottom surface connected between lower ends of the sidewalls. In some exemplary implementations, a depth of the recess region 45 may be greater than about a half of the vertical length of the opening 25 (i.e., about a half of the thickness of the upper structure 20).

In some exemplary implementations, a thickness of the first tungsten layer 40 may be smaller than a half of the minimum width (e.g., the width W2 of FIG. 1) of the opening 25. In this case, the first tungsten layer 40 may have a substantially uniform thickness on the sidewalls and a bottom surface of the opening 25.

In some exemplary implementations, as illustrated in FIG. 9, a thickness of the first tungsten layer 40 may be smaller than about a half of the width (W1 of FIG. 1) of the upper end of the opening 25 and greater than about a half of the width (W2 of FIG. 1) of the lower end of the opening 25. In this case, a portion of the lower region 25L of the opening 25 may be filled with the first tungsten layer 40, as illustrated in FIG. 9. In other words, the first tungsten layer 40 may be thicker on the bottom surface of the opening 25 than on the sidewall of the opening 25.

Figure 3:
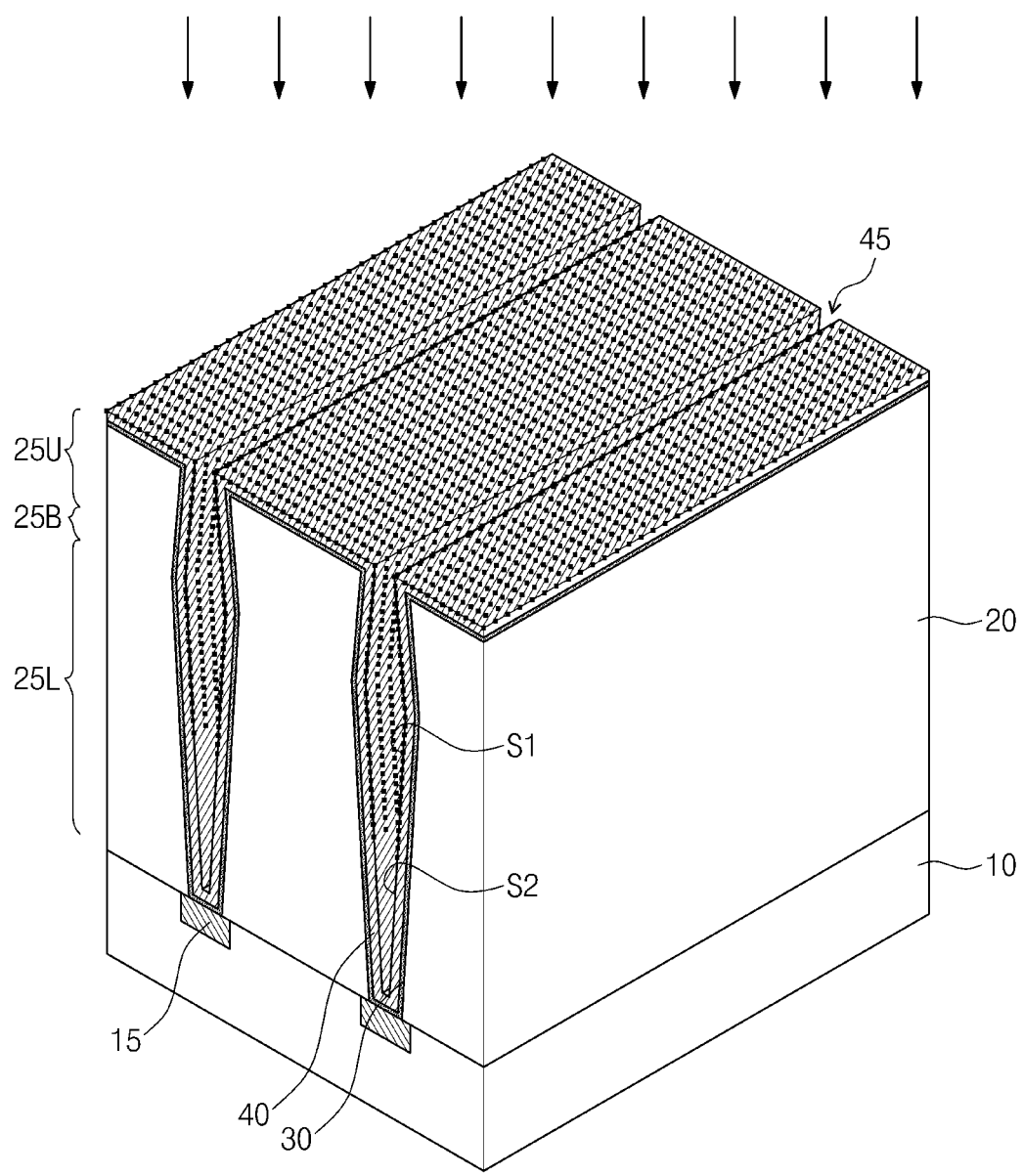
Figure 4:
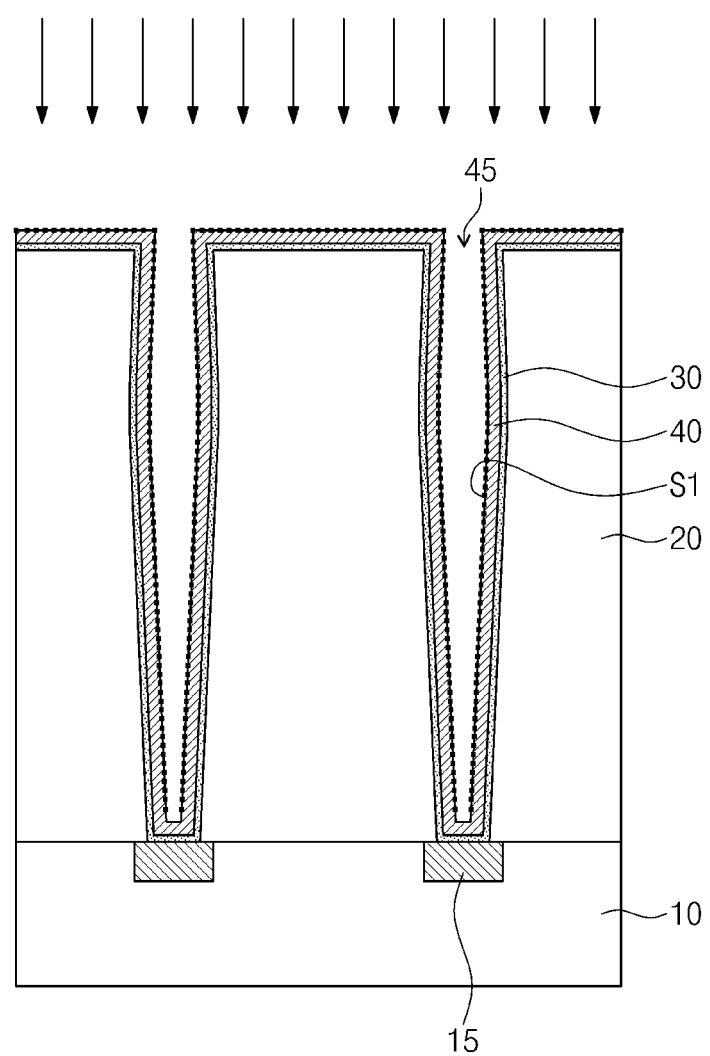

As shown in FIGS. 3 and 4, a surface treatment process may be performed on a portion of the first tungsten layer 40. The surface treatment process may be performed using at least one of a plasma treatment process, a nitridation treatment process, or an ultraviolet (UV) treatment process.

In some exemplary implementations, the surface treatment process may be performed on portions of the sidewalls of the recess region 45. In other words, the surface treatment process may be performed on surfaces of the first tungsten layer 40 formed in the upper region 25U and the bowing region 25B of the opening 25. In addition, the surface treatment process may be performed on a portion of the first tungsten layer 40 formed in the lower region 25L of the opening 25. In certain exemplary implementations, the surface treatment process may be performed on entire sidewalls of the recess region 45, as illustrated in FIG. 4.

The surface of the first tungsten layer 40 defining the recess region 45 may be in an unstable energy state, and thus, a large number of dangling bonds may exist thereon. The dangling bonds may act as the nucleation sites, and the nucleation sites may be reduced by the surface treatment process.

In some exemplary implementations, the first tungsten layer 40 may have a first surface S1 treated by the surface treatment process and a second surface S2 not treated by the surface treatment process. The first surface S1 of the first tungsten layer 40 may be formed in the upper region 25U, the bowing region 25B, and a portion of the lower region 25L in the opening 25. The second surface S2 of the first tungsten layer 40 may be formed in another portion of the lower region 25L of the opening 25. In some exemplary implementations, since the surface of the first tungsten layer 40 is partially treated by the surface treatment process, a growth rate (e.g., a deposition rate) of tungsten on the first surface S1 of the opening 25 may be lower than that of tungsten on the second surface S2 of the opening 25 during a subsequent tungsten deposition process.

In some exemplary implementations, the plasma treatment process as the surface treatment process may be performed on the first tungsten layer 40. A process gas including at least one of Ar, $H_2$, $N_2$, $O_2$, $N_2$, or $NH_3$ may be used during the plasma treatment process. Atoms or ions activated by plasma may be combined with a surface (i.e., the first surface S1) of a portion of the first tungsten layer 40, and thus, the first surface S1 may be in a stable energy state. Thus, a surface morphology of the first surface S1 treated by the plasma may be improved as compared with a surface morphology of the second surface S2 not treated by the plasma. In other words, the number of dangling bonds of the first surface S1 treated by the plasma may be smaller than the number of dangling bonds of the second surface S2 not treated by the plasma. As a result, the nucleation sites on the first surface S1 of the first tungsten layer 40 may be reduced.

According to some exemplary implementations, since the plasma is supplied downward to the opening 25 during the plasma treatment process, the intensity of the plasma in the upper region 25U of the opening 25 may be greater than the intensity of the plasma in the lower region 25L of the opening 25. Thus, a portion of the first tungsten layer 40 disposed in the lower region 25L of the opening 25 may not be treated by the plasma. In other words, an area of the first surface S1 treated by the plasma may be varied depending on the intensity of the plasma during the plasma treatment process. In some exemplary implementations, the first surface S1 of the first tungsten layer 40 may be formed in the upper region 25U, the bowing region 25B, and a portion of the lower region 25L in the opening 25, as illustrated in FIG. 3. In certain exemplary implementations, the entire sidewalls of the recess region 45 may correspond to the first surface S1, as illustrated in FIG. 4.

Figure 5:
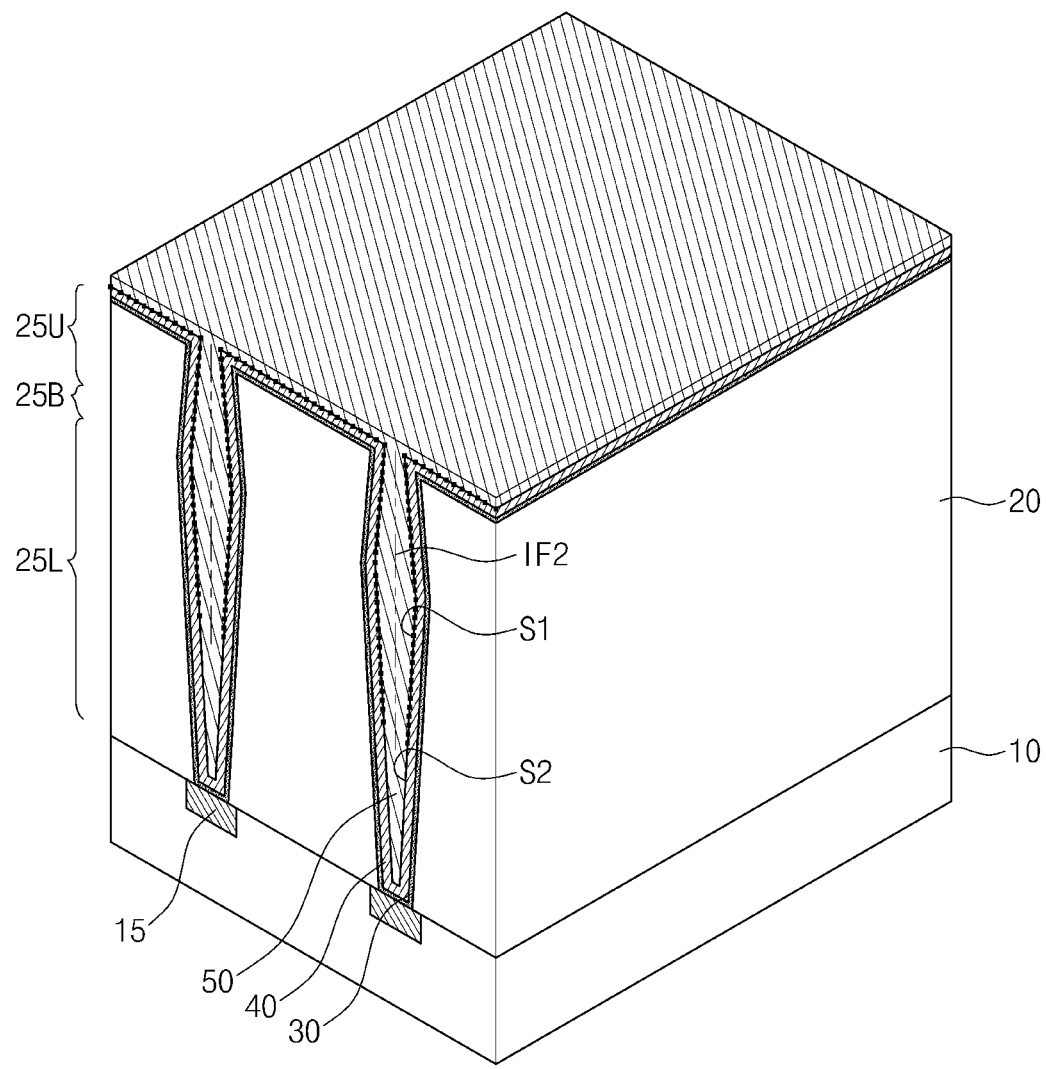

As shown in FIG. 5, a second tungsten layer 50 may be deposited to fill the recess region 45 of the first tungsten layer 40. The second tungsten layer 50 may be deposited using a thermal CVD method, a plasma-enhanced CVD method, a physical CVD method, or an ALD method. For example, the second tungsten layer 50 may be formed by a CVD method using a process gas including tungsten hexafluoride ($WF_6$) and silane ($SiH_4$; or hydrogen ($H_2$)). As described above, since the second tungsten layer 50 is deposited after the surface treatment process, a first interface IF1 may be formed of bonding of the grains of the first tungsten layer 40 and grains of the second tungsten layer 50, as is similarly illustrated in FIGS. 8A, 8B, and 8C (albeit with reference numerals 31, 41, and 51 from FIG. 7).

A grain growth rate and grain sizes of the second tungsten layer 50 may be varied according to a surface state of the first tungsten layer 40. According to some exemplary implementations, the growth rate of the grains of the second tungsten layer 50 on the first surface S1 of the first tungsten layer 40 may be lower than the growth rate of the grains of the second tungsten layer 50 on the second surface S2 of the first tungsten layer 40. Thus, the second tungsten layer 50 may be more rapidly deposited in the lower region 25L of the opening 25 than in the upper region 25U and the bowing region 25B of the opening 25. In other words, the second tungsten layer 50 may fill the opening 25 from the lower region 25L. In addition, a deposition rate (or the growth rate) of the second tungsten layer 50 on the top surface of the upper structure 20 may be lower than that of the second tungsten layer 50 in the upper region 25U of the opening 25. Thus, a thickness of the second tungsten layer 50 deposited on the top surface of the upper structure 20 may be smaller than that of the second tungsten layer 50 deposited on the sidewall of the opening 25.

Since the nucleation sites of the second surface S2 of the first tungsten layer 40 are more than the nucleation sites of the first surface S1 of the first tungsten layer 40 when the second tungsten layer 50 is formed, large-sized tungsten grains may be grown on the first surface S1 of the first tungsten layer 40 and small-sized tungsten grains may be grown on the second surface S2 of the first tungsten layer 40. In other words, sizes of the grains on the first surface S1 may be greater than those of the grains on the second surface S2 when the second tungsten layer 50 is deposited. In addition, the grains of the second tungsten layer 50 grown on the first surface S1 may be larger than the grains of the first tungsten layer 40.

The grains of the second tungsten layer 50 grown from the first surface S1 and the second surface S2 may be laterally grown until they are in contact with each other. In other words, the grains of the second tungsten layer 50 grown from the sidewalls of the recess region 45 may meet each other in a central region of the recess region 45, and thus, a second interface IF2 may be formed in the central region of the recess region 45 by the grains of the second tungsten layer 50.

In some exemplary implementations, due to the surface treatment process, the growth rate of the tungsten grains may become progressively less from the lower region 25L toward the upper region 25U of the opening 25. Thus, the second tungsten layer 50 may fill the opening 25 from the lower region 25L. As a result, it is possible to completely fill the opening 25 with the tungsten layers 40 and 50 without a void or seam.

Figure 6:
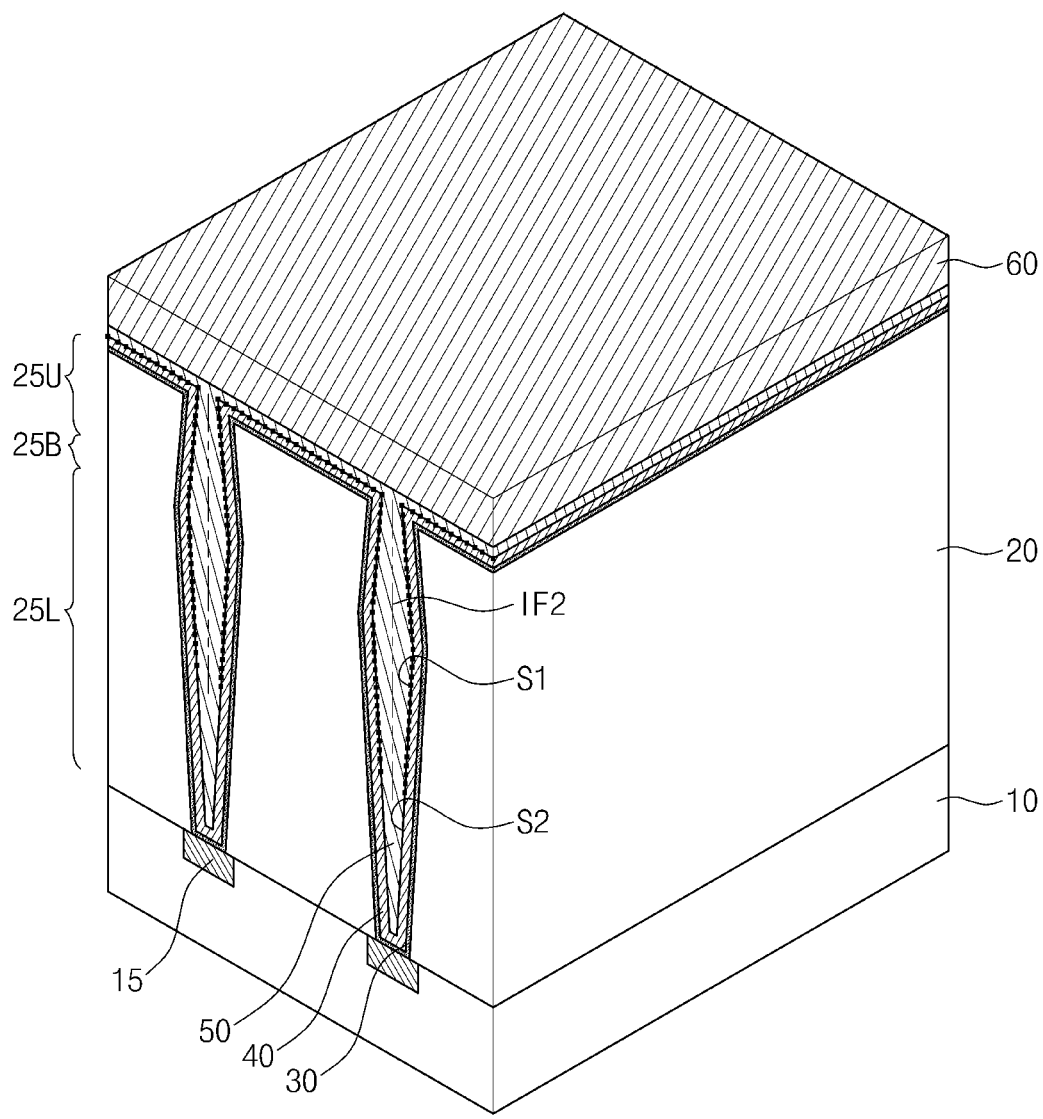

As shown in FIG. 6, a third tungsten layer 60 may be deposited on the second tungsten layer 50 completely filling the recess region 45. In other words, the third tungsten layer 60 may be deposited on the top surface of the upper structure 20. A deposition rate of the third tungsten layer 60 may be higher than that of the second tungsten layer 50. The third tungsten layer 60 may be rapidly deposited for a predetermined time, so the third tungsten layer 60 may be thicker than the second tungsten layer 50. Also, grain sizes of the third tungsten layer 60 may be larger than those of the second tungsten layer 50, and the third tungsten layer 60 may have a rough surface. The third tungsten layer 60 may function as a buffer during a subsequent planarization process. In certain exemplary implementations, the third tungsten layer 60 may be omitted.

Figure 7:
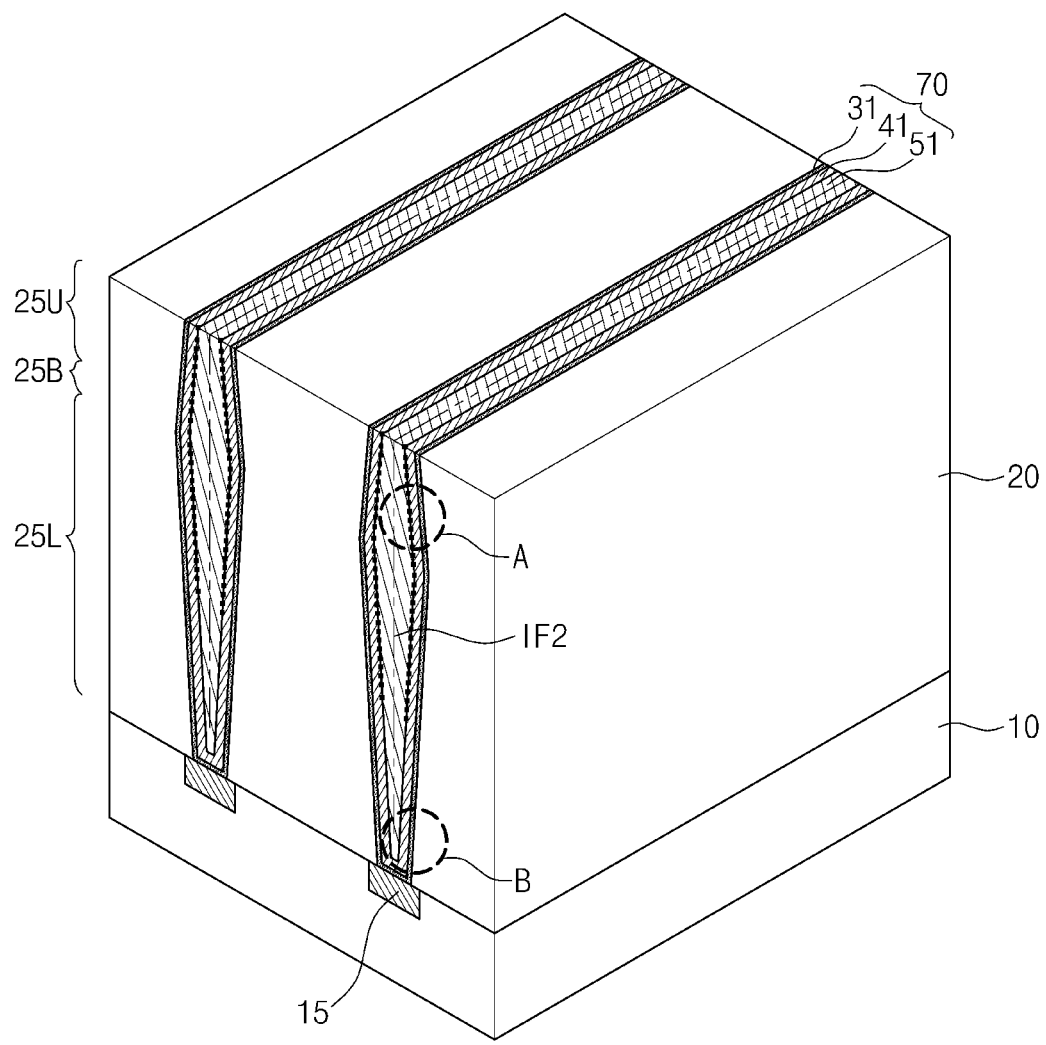

As shown in FIG. 7, a planarization process may be performed on the first to third tungsten layers 41, 51, and 60 and the barrier metal layer 31 until the top surface of the upper structure 20 is exposed. The planarization process may be performed using a blanket anisotropic etching process (e.g., an etch-back process) and/or a chemical mechanical polishing (CMP) process.

A connection structure 70 may be formed in the opening 25 by the planarization process. The connection structure 70 may completely fill the opening 25. The connection structure 70 may include a barrier metal pattern 31, a first tungsten pattern 41, and a second tungsten pattern 51. In some exemplary implementations, the connection structure 70 may have a linear shape extending in one direction and may be in contact with the lower conductor 15. In certain exemplary implementations, the connection structure 70 may have a cylindrical shape.

A vertical length of the connection structure 70 may be substantially equal to the thickness of the upper structure 20. The vertical length of the connection structure 70 may mean a length from the top surface of the lower structure 10 to a top surface of the connection structure 70. A sidewall profile of the connection structure 70 filling the opening 25 may be the substantially same as the sidewall profile of the opening 25. Thus, the connection structure 70 may include an upper portion having a negatively sloped sidewall and a lower portion having a positively sloped sidewall, or vice versa. Accordingly, the opposite sidewall surfaces have, respectively, negative slope to positive slope and positive slope to negative slope sidewall surfaces. A bowing portion is provided between the upper portion and the lower portion. The bowing portion of the connection structure 70 may be disposed at a level higher than a half of the thickness of the upper structure 20 from the top surface of the lower structure 10. In other words, a vertical length of the lower portion of the connection structure 70 may be greater than a sum of vertical lengths of the upper portion and the bowing portion of the connection structure 70. The bowing portion of the connection structure 70 may have the third width (W3 of FIG. 1), and the third width (W3 of FIG. 1) may be greater than widths (W1 and W2 of FIG. 1) of the upper portion and the lower portion of the connection structure 70. In some exemplary implementations, the third width (W3 of FIG. 1) may be the maximum width of the connection structure 70.

As shown in FIGS. 8A, 8B, and 8C, the grains of the first tungsten pattern 41 may be in contact with the grains of the second tungsten pattern 51 to form the first interface IF1 in the connection structure 70. In addition, the grains of the second tungsten pattern 51 may be in contact with each other to form the second interface IF2 in a central region of the connection structure 70. In some exemplary implementations, the connection structure 70 may have a linear shape extending in one direction, and thus, the first and second interfaces IF1 and IF2 may extend in the one direction. In addition, a vertical length of the second interface IF2 formed in the second tungsten pattern 51 may be greater than a half of the vertical length of the connection structure 70.

In some exemplary implementations a mean grain size in the second tungsten pattern 51 may be greater than a mean grain size in the first tungsten pattern 41. Grain sizes of second tungsten pattern 51 grown from the first surface of the first tungsten pattern 41 may be larger than those of second tungsten pattern 51 grown from the second surface of the first tungsten pattern 41. In other words, as illustrated in FIGS. 8A and 8B, the grain sizes of the second tungsten pattern 51 may be larger in the upper portion of the connection structure 70 than in the lower portion of the connection structure 70. As illustrated in FIG. 8A, the sizes of the grains of the second tungsten pattern 51 may be greater than those of the grains of the first tungsten pattern 41 in the upper portion of the connection structure 70. As illustrated in FIG. 8B, the sizes of the grains of the second tungsten pattern 51 may be similar to those of the grains of the first tungsten pattern 41 in the lower portion of the connection structure 70.

Alternatively, in the case in which the entire sidewalls of the recess region 45 are treated by the surface treatment process as described with reference to FIG. 4, the sizes of the grains of the second tungsten pattern 51 may be greater than those of the grains of the first tungsten pattern 41 in the lower portion as well as the upper portion of the connection structure 70, as shown in FIG. 8C.

Figure 10:
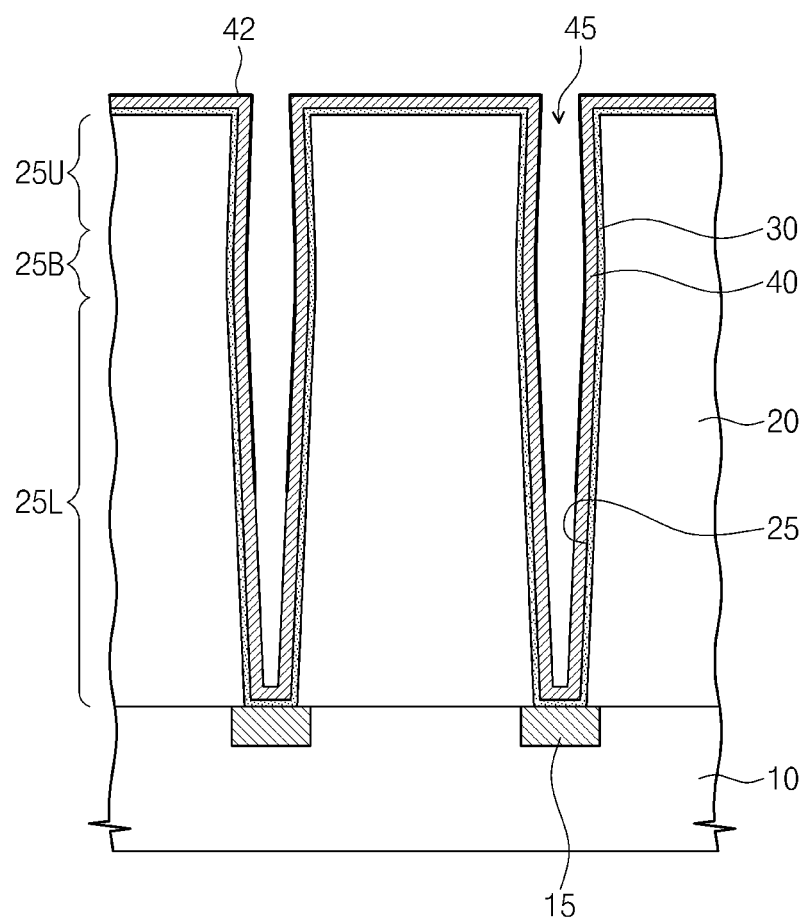
FIGS. 10 and 11 are cross-sectional views illustrating a method for fabricating a semiconductor device according to some exemplary implementations of the disclosed subject matter.
Figure 11:
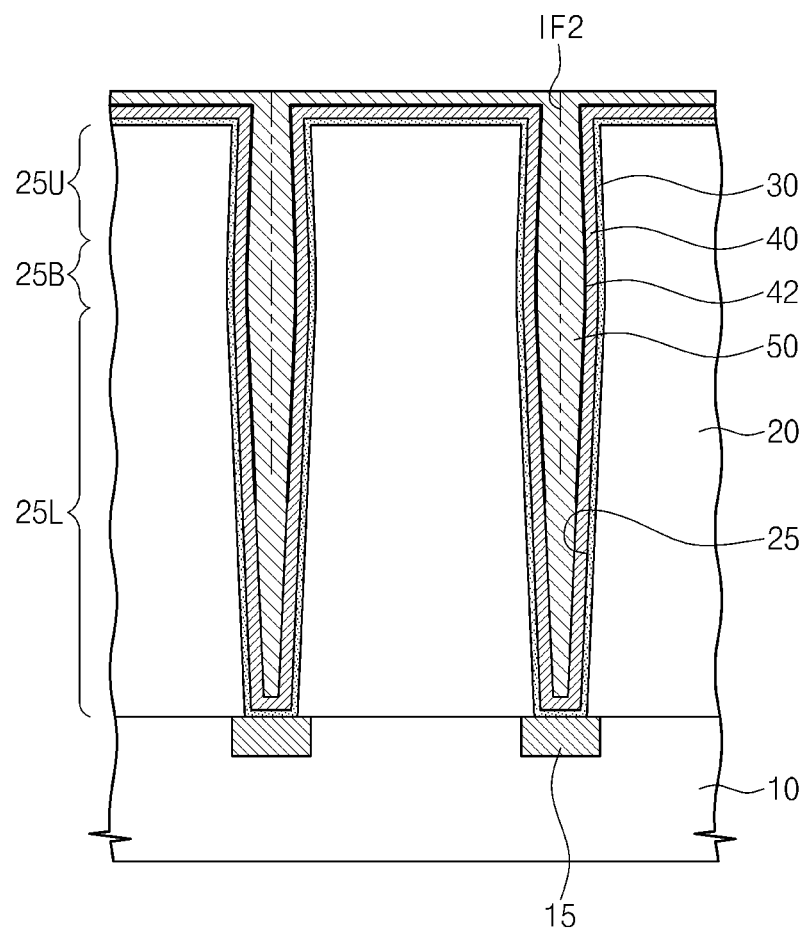

FIGS. 10 and 11 are cross-sectional views illustrating a method for fabricating a semiconductor device according to some exemplary implementations of the disclosed subject matter. In the present exemplary implementation, the descriptions to the same technical features as in the processes described with reference to FIGS. 1 and 2 will be omitted or mentioned briefly for the purpose of ease and convenience in explanation.

As shown in FIG. 10, a barrier metal layer 30 and a first tungsten layer 40 may be sequentially deposited on the inner surface of an opening 25 exposing a lower conductor 15.

The first tungsten layer 40 may define a recess region 45 in the opening 25 and may be deposited on a surface of the barrier metal layer 30. The recess region 45 may have sidewalls facing each other and a bottom surface connected between lower ends of the sidewalls. In some exemplary implementations, a depth of the recess region 45 may be greater than a half of a depth of the opening 25 (i.e., a half of a thickness of an upper structure 20).

In some exemplary implementations, after the deposition of the first tungsten layer 40, a metal nitride layer 42 may be formed on a portion of a surface of the first tungsten layer 40 by a deposition method having a poor step-coverage characteristic. For example, the metal nitride layer 42 may include TiN, TaN, WN, MoN, NbN, TiSiN, TiAlN, TiBN, ZrSiN, WSiN, WBN, ZrAlN, MoSiN, MoAlN, TaSiN, or TaAlN.

For example, the deposition method having the poor step-coverage characteristic may include a PVD method, a metal organic CVD (MOCVD) method, a collimated sputtering method, an ionized metal PVD (IMP) method, or any combination thereof.

The metal nitride layer 42 may be thinner than the first tungsten layer 40. In addition, the metal nitride layer 42 may be thinner than the barrier metal layer 30. When the deposition method having the poor step-coverage characteristic is performed to deposit the metal nitride layer 42, the metal nitride layer 42 deposited on the sidewalls of the opening 25 may be thinner than the metal nitride layer 42 deposited on the top surface of the upper structure 20 due to the characteristic of the deposition method. In other words, an overhang of the metal nitride layer 42 may be formed on an upper end of the opening 25, and thus, the metal nitride layer 42 may become progressively thinner from the upper region 25U toward the lower region 25L of the opening 25. The metal nitride layer 42 may be formed in the upper region 25U and the bowing region 25B of the opening 25 and may expose a portion of the first tungsten layer 40 which is formed in the lower region 25L of the opening 25.

The metal nitride layer 42 formed in the upper region 25U and the bowing region 25B of the opening 25 may inhibit tungsten from being deposited during a subsequent process of forming a second tungsten layer 50.

As shown in FIG. 11, the second tungsten layer 50 may be deposited to fill the recess region 45 of the first tungsten layer 40 in which the metal nitride layer 42 is formed.

During the deposition of the second tungsten layer 50, a deposition rate of tungsten in the upper region 25U and the bowing region 25B of the opening 25 in which the metal nitride layer 42 is formed may be lower than a deposition rate of tungsten in the lower region 25L of the opening 25. In other words, during the deposition of the second tungsten layer 50, the deposition rate of tungsten on a surface of the metal nitride layer 42 may be lower than the deposition rate of tungsten on a surface of the first tungsten layer 40. Thus, the second tungsten layer 50 may fill the opening 25 from the lower region 25L. As a result, the second tungsten layer 50 may completely fill the recess region 45 having a high aspect ratio.

In some exemplary implementations, the metal nitride layer 42 may be disposed between the grains of the first tungsten layer 40 and the grains of the second tungsten layer 50 in the upper region 25U of the opening 25. The grains of the first tungsten layer 40 may be in direct contact with the grains of the second tungsten layer 50 in the lower region 25L of the opening 25.

The grains of the second tungsten layer 50 grown from the surfaces of the metal nitride layer 42 and the first tungsten layer 40 may be laterally grown until they are in contact with each other. In other words, the grains of the second tungsten layer 50 grown from the opposite sidewalls of the recess region 45 may meet each other in a central region of the recess region 45, and thus, a second interface IF2 formed by the grains of the second tungsten layer 50 may be formed in the central region of the recess region 45.

Thereafter, a planarization process may be performed on the second tungsten layer 50, the first tungsten layer 40, and the barrier metal layer 30 to form a connection structure in the opening 25.

Figure 12:
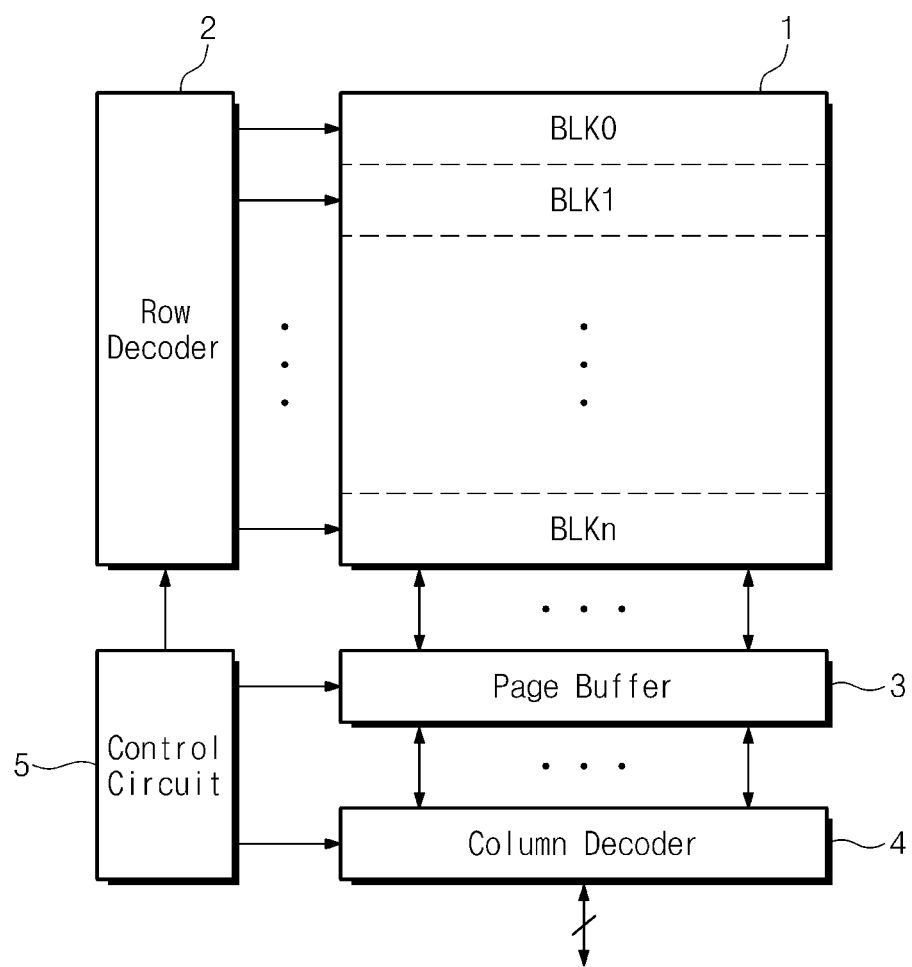
FIG. 12 is a schematic block diagram illustrating a three-dimensional (3D) semiconductor memory device according to some exemplary implementations of the disclosed subject matter.
Figure 13:
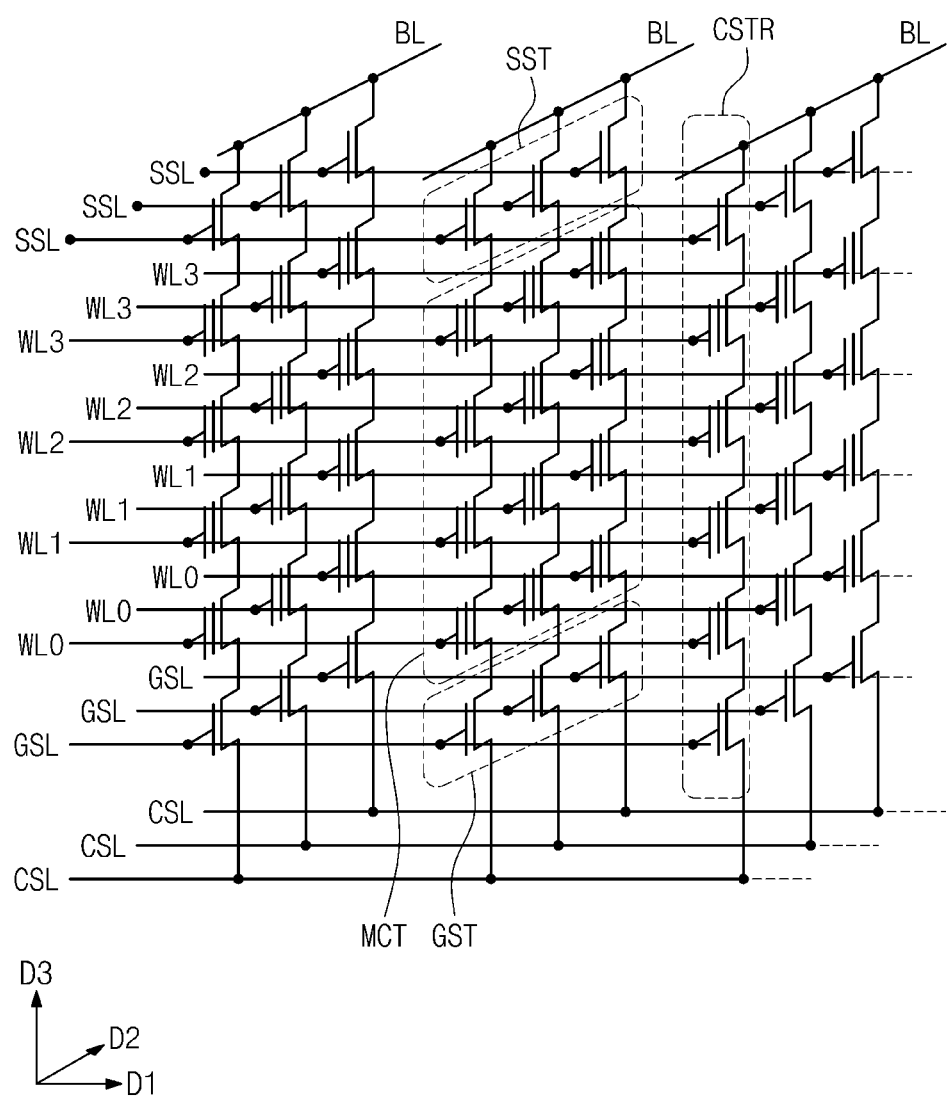
FIG. 13 is a schematic circuit diagram illustrating a cell array of a 3D semiconductor memory device according to some exemplary implementations of the disclosed subject matter.

FIG. 12 is a schematic block diagram illustrating a three-dimensional (3D) semiconductor memory device according to some exemplary implementations of the disclosed subject matter. FIG. 13 is a schematic circuit diagram illustrating a cell array of a 3D semiconductor memory device according to some exemplary implementations of the disclosed subject matter.

As shown in FIG. 12, a 3D semiconductor memory device may include a memory cell array 1, a row decoder 2, a page buffer 3, a column decoder 4, and a control circuit 5.

The memory cell array 1 may include a plurality of memory blocks BLK0 to BLKn. Each of the memory blocks BLK0 to BLKn may include a plurality of memory cells, a plurality of word lines, and a plurality of bit lines. The word lines and the bit lines may be electrically connected to the memory cells.

The row decoder 2 may decode an address signal inputted from an external system to select one of the word lines. The address signal decoded in the row decoder 2 may be provided to a row driver (not shown). The row driver may provide word line voltages generated from a voltage generation circuit (not shown) to the selected word line and unselected word lines in response to a control signal of the control circuit 5. The row decoder 2 may be connected in common to the plurality of memory blocks BLK0 to BLKn and may provide driving signals to the word lines of a memory block selected by a block selection signal.

The page buffer 3 may be connected to the memory cell array 1 through the bit lines to sense data stored in the memory cells. The page buffer 3 may be connected to a bit line selected by an address signal decoded in the column decoder 4. According to an operation mode, the page buffer 3 may temporarily store data to be stored in the memory cells or may sense data stored in the memory cells. For example, the page buffer 3 may be operated as a write driver during a program operation mode and may be operated as a sense amplifier during a sensing operation mode. The page buffer 3 may receive power (e.g., voltage or current) from the control circuit 5 and may provide the received power to the selected bit line.

The column decoder 4 may provide a data-transmitting path between the page buffer 3 and an external device (e.g., a memory controller). The column decoder 4 may decode the address signal inputted from the external device to select one of the bit lines. The column decoder 4 may be connected in common to the plurality of memory blocks BLK0 to BLKn and may provide data to the bit lines of the memory block selected by the block selection signal.

The control circuit 5 may control overall operations of the 3D semiconductor memory device. The control circuit 5 may receive control signals and an external voltage and may be operated in response to the received control signals. The control circuit 5 may include a voltage generator that generates voltages (e.g., a program voltage, a sensing voltage, and an erase voltage) necessary to inner operations by means of the external voltage. The control circuit 5 may control a sensing operation, a write operation, and/or an erase operation in response to the control signals.

As shown in FIG. 13, a cell array of a 3D semiconductor memory device according to some exemplary implementations may include a common source line CSL, a plurality of bit lines BL, and a plurality of cell strings CSTR connected between the common source line CSL and the bit lines BL.

The bit lines BL may be two-dimensionally arranged. A plurality of the cell strings CSTR may be connected in parallel to each of the bit lines BL. The cell strings CSTR may be connected in common to the common source line CSL. In other words, a plurality of the cell strings CSTR may be disposed between one common source line CSL and the plurality of bit lines BL. In some exemplary implementations, the common source line CSL may include a plurality of common source lines CSL two-dimensionally arranged. In an exemplary implementation, the same voltage may be applied to the plurality of the common source lines CSL. In an exemplary implementation, the common source lines CSL may be electrically controlled independently of each other.

Each of the cell strings CSTR may include a ground selection transistor GST connected to the common source line CSL, a string selection transistor SST connected to the bit line BL, and a plurality of memory cell transistors MCT interposed between the ground and string selection transistors GST and SST. The ground selection transistor GST, the memory cell transistors MCT, and the string selection transistor SST may be connected in series to each other in the order named.

The common source line CSL may be connected in common to sources of the ground selection transistors GST. A ground selection line GSL, a plurality of word lines WL0 to WL3 and a string selection line SSL which are disposed between the common source line CSL and the bit lines BL may be used as gate electrodes of the ground selection transistor GST, the memory cell transistors MCT and the string selection transistor SST, respectively. Each of the memory cell transistors MCT may include a data storage element.

Figure 14:
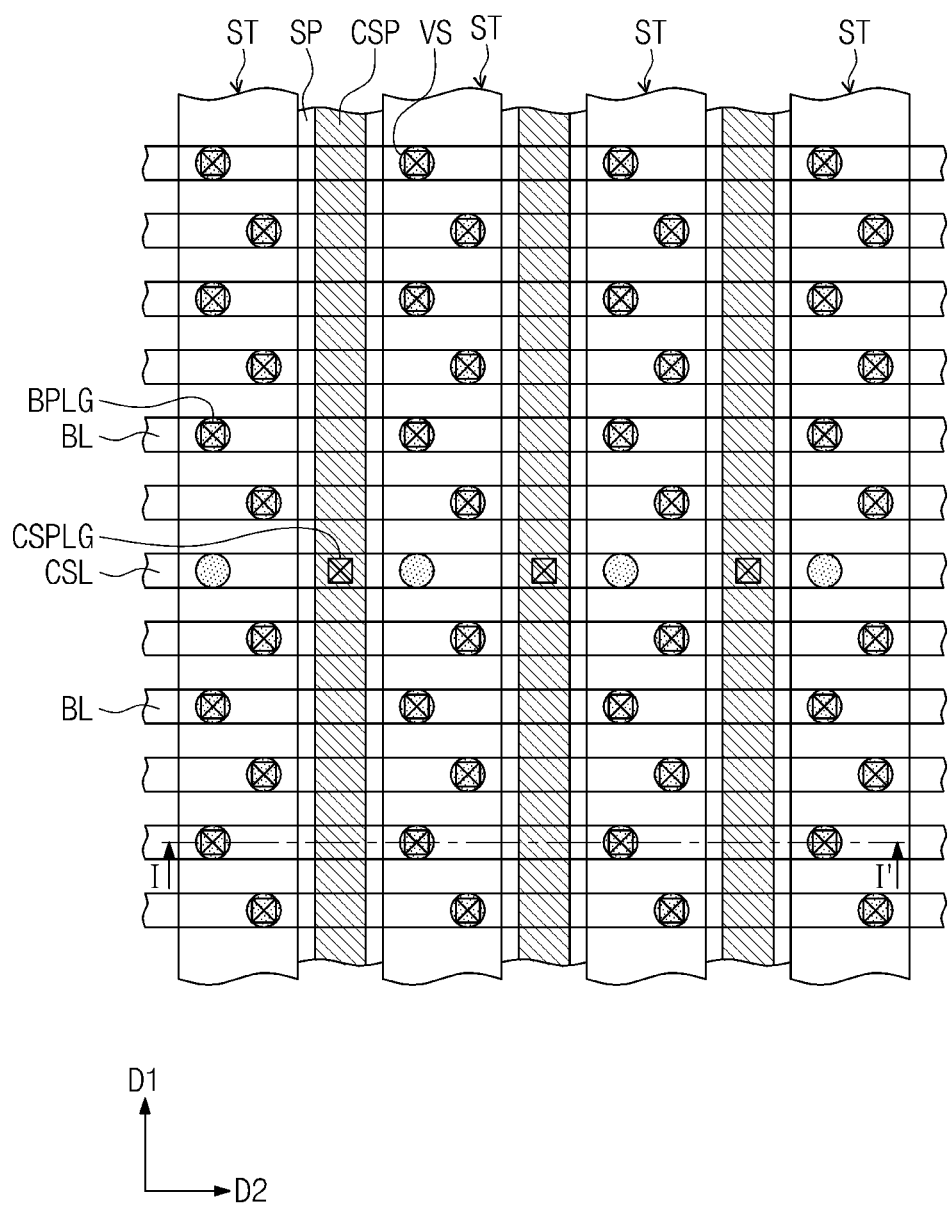
FIG. 14 is a plan view illustrating a 3D semiconductor memory device according to some exemplary implementations of the disclosed subject matter.

FIG. 14 is a plan view illustrating a 3D semiconductor memory device according to some exemplary implementations. FIGS. 15 to 24 are cross-sectional views taken along a line I-I' of FIG. 14 to illustrate a method for fabricating a 3D semiconductor memory device according to some exemplary implementations of the inventive concepts. FIGS. 25A and 25B are enlarged views of a portion 'A' of FIG. 22. FIGS. 26A, 26B, 26C, and 26D are enlarged views of a portion 'B' of FIG. 22.

Figure 15:
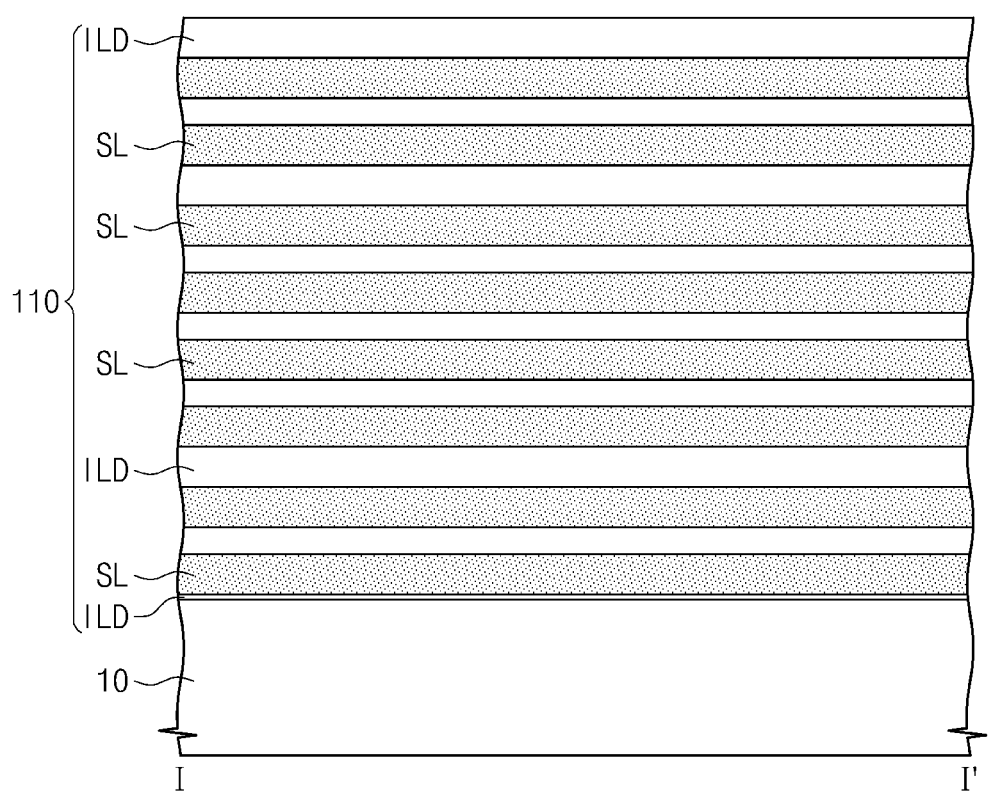
FIGS. 15 to 24 are cross-sectional views taken along a line I-I' of FIG. 14 to illustrate a method for fabricating a 3D semiconductor memory device according to some exemplary implementations of the disclosed subject matter.

As shown in FIGS. 14 and 15, sacrificial layers SL and insulating layers ILD may be alternately and repeatedly stacked on a substrate 10 to form a thin-layer structure 110.

The substrate 10 may be a bulk silicon substrate, a silicon-on-insulator (SOI) substrate, a germanium substrate, a germanium-on-insulator (GOI) substrate, a silicon-germanium substrate, or a substrate including an epitaxial layer obtained by performing a selective epitaxial growth (SEG) process.

In the thin-layer structure 110, the sacrificial layers SL may be formed of a material having an etch selectivity with respect to the insulating layers ILD. For example, a difference between an etch rate of the sacrificial layers SL and an etch rate of the insulating layers ILD may be relatively great in a wet etching process using a chemical solution, and a difference between an etch rate of the sacrificial layers SL and an etch rate of the insulating layers ILD may be relatively small in a dry etching process using an etching gas.

In some exemplary implementations, the sacrificial layers SL and the insulating layers ILD may be formed of insulating materials having an etch selectivity with respect to each other. For example, each of the sacrificial layers SL may include at least one of an undoped silicon layer, a silicon oxide layer, an undoped silicon carbide layer, an undoped silicon-germanium layer, a silicon oxynitride layer, or a silicon nitride layer. Each of the insulating layers ILD may include at least one of an undoped silicon layer, a silicon oxide layer, an undoped silicon carbide layer, a silicon oxynitride layer, or a silicon nitride layer.

At this time, the insulating layers ILD may be formed of a different material from the sacrificial layers SL. In some exemplary implementations, the sacrificial layers SL may be formed of silicon nitride layers, and the insulating layers ILD may be formed of silicon oxide layers. In certain exemplary implementations, the sacrificial layers SL may be formed of a conductive material, and the insulating layers ILD may be formed of an insulating material.

The sacrificial layers SL and the insulating layers ILD may be deposited using a thermal CVD technique, a plasma-enhanced CVD technique, a physical CVD technique, or an ALD technique.

In some exemplary implementations, thicknesses of the sacrificial layers SL may be substantially equal to each other. In certain exemplary implementations, the lowermost one and the uppermost one of the sacrificial layers SL may be thicker than other sacrificial layers SL disposed between the lowermost sacrificial layer and the uppermost sacrificial layer. In some exemplary implementations, thicknesses of the insulating layers ILD may be equal to each other. In certain exemplary implementations, thicknesses of one or some of the insulating layers ILD may be different from those of other insulating layers ILD. In some exemplary implementations, the lowermost insulating layer ILD of the thin-layer structure 110 may be thinner than the sacrificial layers SL and the insulating layers ILD disposed thereon. The lowermost insulating layer ILD may include a silicon oxide layer formed by a thermal oxidation process.

Figure 16:
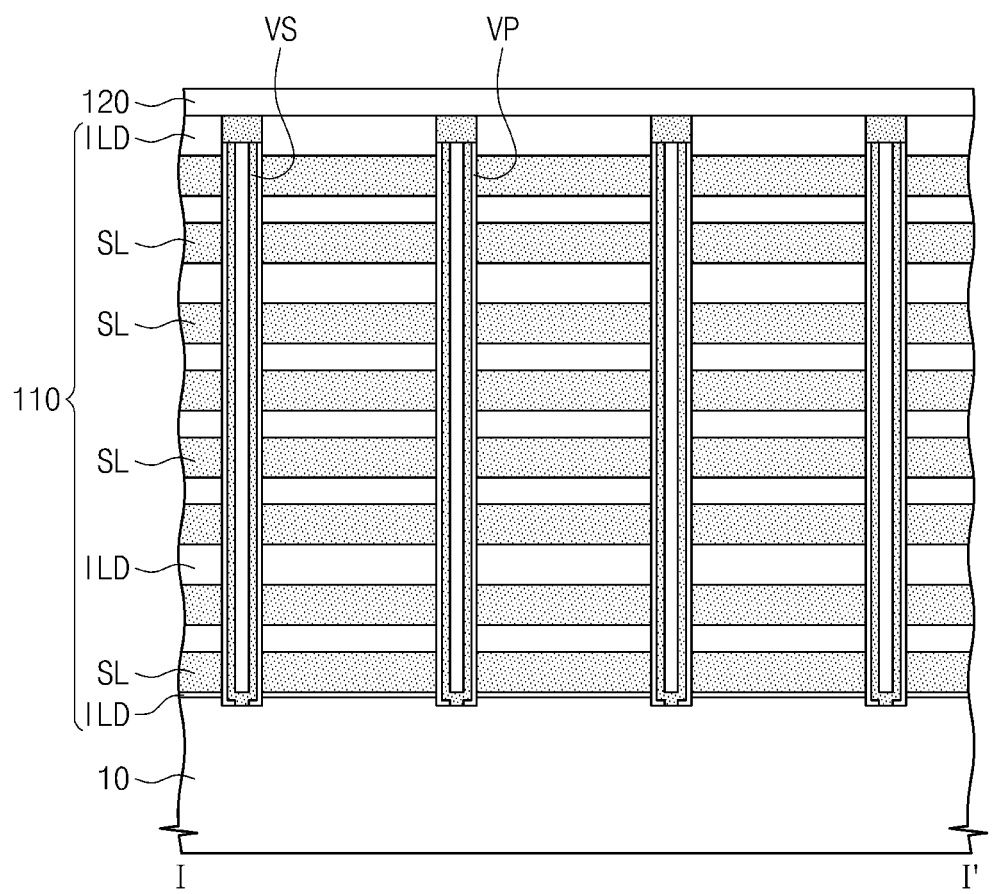

As shown in FIGS. 14 and 16, vertical structures VS may be formed to penetrate the thin-layer structure 110. The vertical structures VS may be connected to the substrate 10 (e.g., a semiconductor substrate) and may include a semiconductor material or a conductive material.

In some exemplary implementations, forming the vertical structures VS may include forming openings penetrating the thin-layer structure 110, and forming semiconductor patterns in the openings, respectively.

A mask pattern (not shown) may be formed on the thin-layer structure 110, and thin-layer structure 110 may be anisotropically etched using the mask pattern (not shown) as an etch mask to form the openings. The top surface of the substrate 10 under the openings may be over-etched in the anisotropic etching process, and thus the top surface of the substrate 10 exposed by the openings may be recessed to a predetermined depth. A width of a lower region of the opening may be smaller than a width of an upper region of the opening. The openings may be arranged in a line or in a zigzag from along one direction when viewed from a plan view.

Forming the semiconductor patterns in the openings may include forming semiconductor spacers exposing the substrate 10 and covering sidewalls of the openings, and forming semiconductor body portions connected to the substrate 10 in the openings. The semiconductor pattern may have a hollow pipe shape or a hollow macaroni shape. At this time, the semiconductor pattern may have a closed bottom end. The semiconductor pattern may include silicon (Si), germanium (Ge), or a combination thereof. The semiconductor pattern may include a semiconductor doped with dopants or an intrinsic semiconductor not doped with dopants. The semiconductor pattern may have a crystal structure including at least one of a single-crystalline structure, an amorphous structure, or a poly-crystalline structure. The vertical structure VS may include a conductive pad that is formed in a top end portion of vertical structure VS. The conductive pad may be a dopant region doped with dopants or may be formed of a conductive material.

Figure 24:
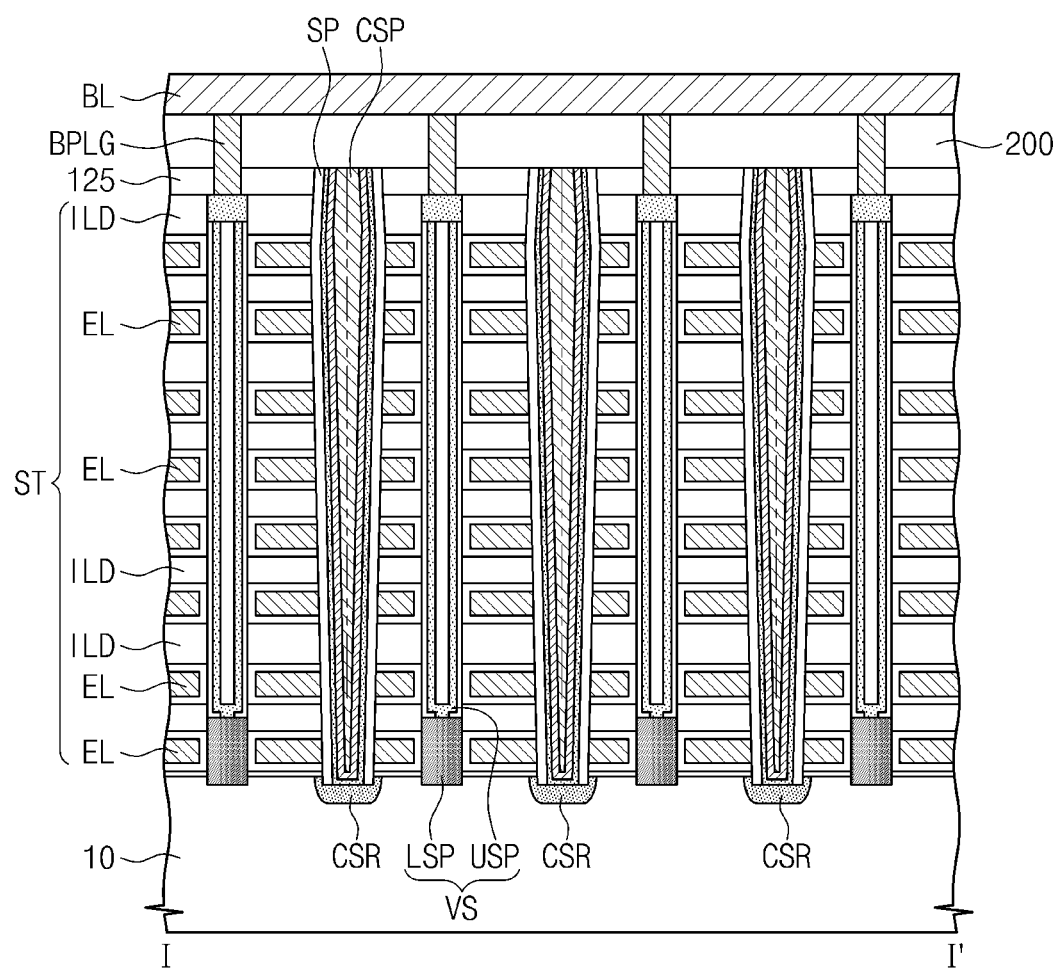
Figure 25A:
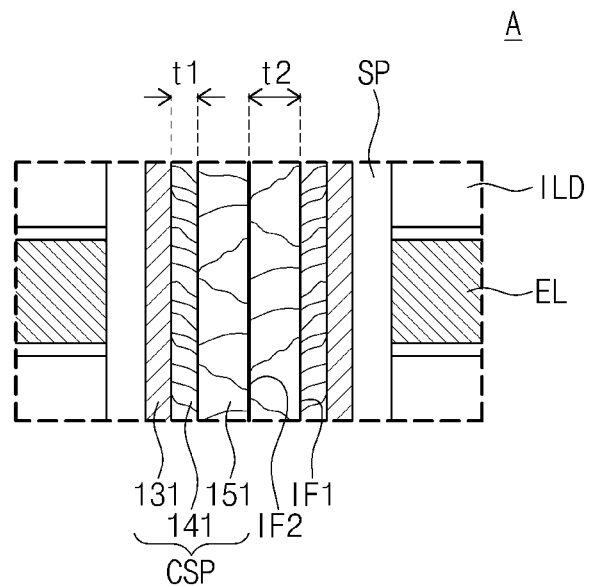
FIGS. 25A and 25B are enlarged views of a portion 'A' of FIG. 22.
Figure 25B:
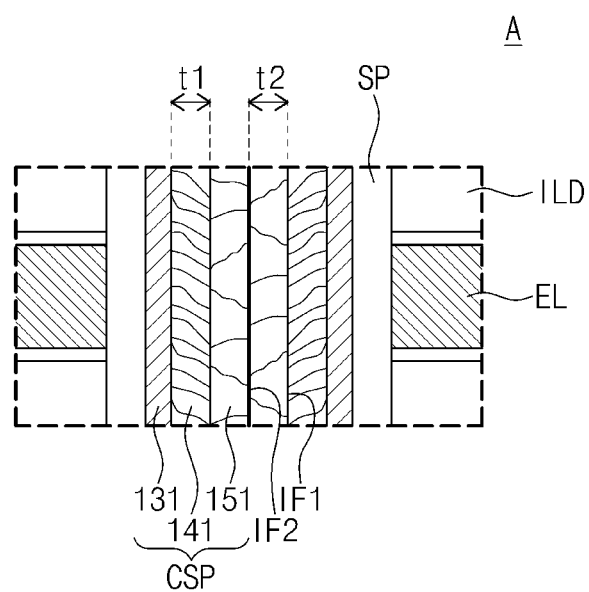

In certain exemplary implementations, as illustrated in FIG. 24, forming the vertical structures VS may include forming openings penetrating the thin-layer structure 110, forming a lower semiconductor pattern LSP filling each of lower regions of the openings, forming a vertical insulating pattern VP in each of the openings having the lower semiconductor patterns LSP, and forming an upper semiconductor pattern USP connected to the lower semiconductor pattern LSP in each of the openings having the vertical insulating patterns VP. Here, the lower semiconductor pattern LSP may be used as a channel region of the ground selection transistor GST described with reference to FIG. 13. The lower semiconductor pattern LSP may be formed of a semiconductor material doped with dopants of the same conductivity type as the substrate 10. In some exemplary implementations, the lower semiconductor pattern LSP may be an epitaxial pattern that is formed using an epitaxial technique or laser crystallization technique using the substrate 10 as a seed. In this case, the lower semiconductor pattern LSP may have a single-crystalline structure or may have a poly-crystalline structure having a greater grain size than a semiconductor material formed by a CVD technique. In certain exemplary implementations, the lower semiconductor pattern LSP may be formed of a poly-crystalline semiconductor material (e.g., poly-silicon). In some exemplary implementations, an insulating pattern adjacent to the lower semiconductor pattern LSP may be in direct contact with a sidewall of the lower semiconductor pattern LSP. In some exemplary implementations, the lower semiconductor pattern LSP may have a pillar shape penetrating the lowermost sacrificial layer SL. A bottom surface of the lower semiconductor pattern LSP may be disposed at a lower level than a top surface of the substrate 10, and a top surface of the lower semiconductor pattern LSP may be disposed at a higher level than a top surface of the lowermost sacrificial layer SL.

In some exemplary implementations, vertical insulating patterns VP may be formed in the openings before the formation of the vertical structures VS. The vertical insulating pattern VP may include one thin layer or a plurality of thin layers. According to exemplary implementations, the vertical insulating pattern VP may correspond to a portion of a data storage layer. The data storage layer will be described later in more detail with reference to FIGS. 26A to 26D.

As shown in FIG. 16, a capping dielectric layer 120 may be formed on a top surface of the thin-layer structure 110 after the formation of the vertical structures VS.

Figure 17:
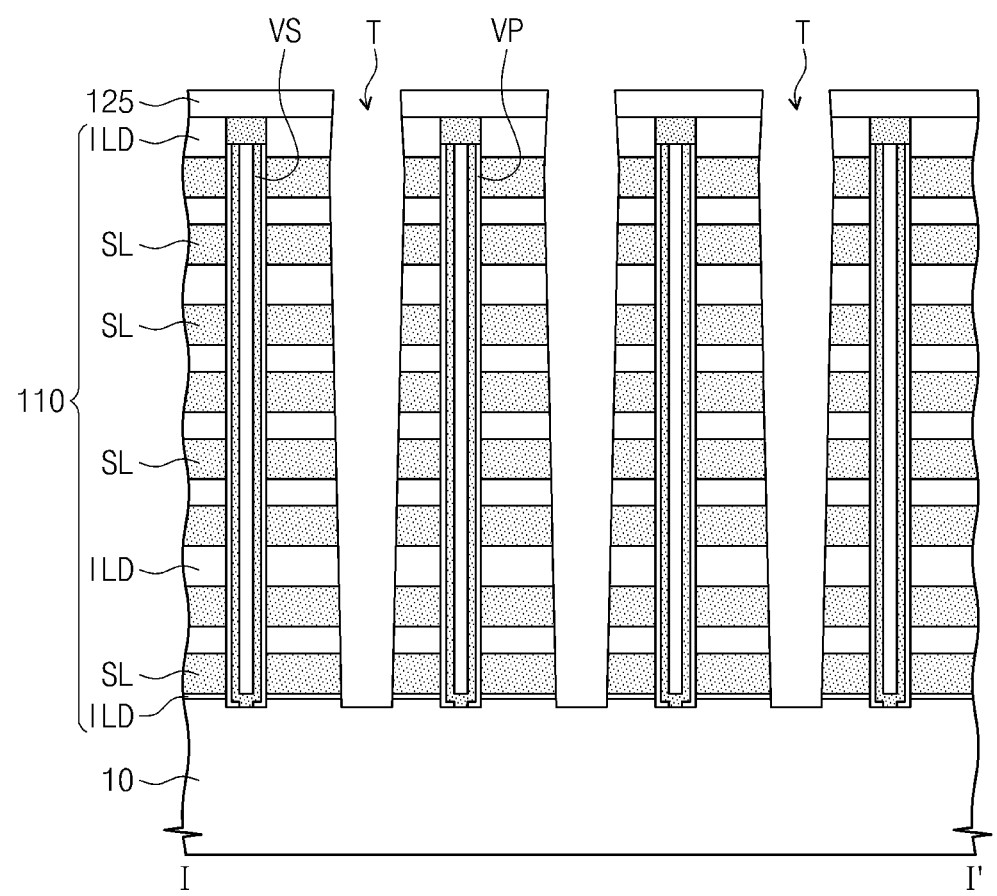

As shown in FIGS. 16 and 17, the capping dielectric layer 120 and the thin-layer structure 110 may be patterned to form trenches T exposing the substrate 10 between the vertical structures VS.

Forming the trenches T may include forming a mask pattern (not shown) defining planar positions of the trenches T on the thin-layer structure 110, and anisotropically etching the thin-layer structure 110 using the mask pattern (not shown) as an etch mask.

The trench T may be spaced apart from the vertical structures VS and may expose sidewalls of the sacrificial layers SL and the insulating layers ILD. The trench T may have a linear or rectangular shape extending in a first direction D1 when viewed from a plan view. As described above, the trench T may expose the substrate 10 when viewed from a cross-sectional view. The top surface of the substrate 10 exposed by the trench T may be recessed to a predetermined depth by over-etching of the process of forming the trench T. In some exemplary implementations, the trench T may have an inclined sidewall.

Since the trenches T are formed, the thin-layer structure 110 may be divided into line-shaped structures extending in the first direction D1 (FIG. 14). In addition, a capping dielectric pattern 125 may be formed on each of the line-shaped structures of the thin-layer structure 110, as shown in FIG. 17. A plurality of the vertical structures VS may penetrate each of the line-shaped structures of the thin-layer structure 110.

In some exemplary implementations, each of the trenches T may include an upper region (see 25U of FIG. 1), a lower region (see 25L of FIG. 1), and a bowing region (see 25B of FIG. 1) between the upper region and the lower region, like the opening 25 described with reference to FIG. 1. Each of the trenches T may have the maximum width (see W3 of FIG. 1) in the bowing region. In some exemplary implementations, the bowing region of the trench T may be disposed at a higher level than a bottom surface of the uppermost sacrificial layer SL. Alternatively, the bowing region of the trench T may be disposed at a higher level than a top surface of the uppermost sacrificial layer SL.

Figure 18:
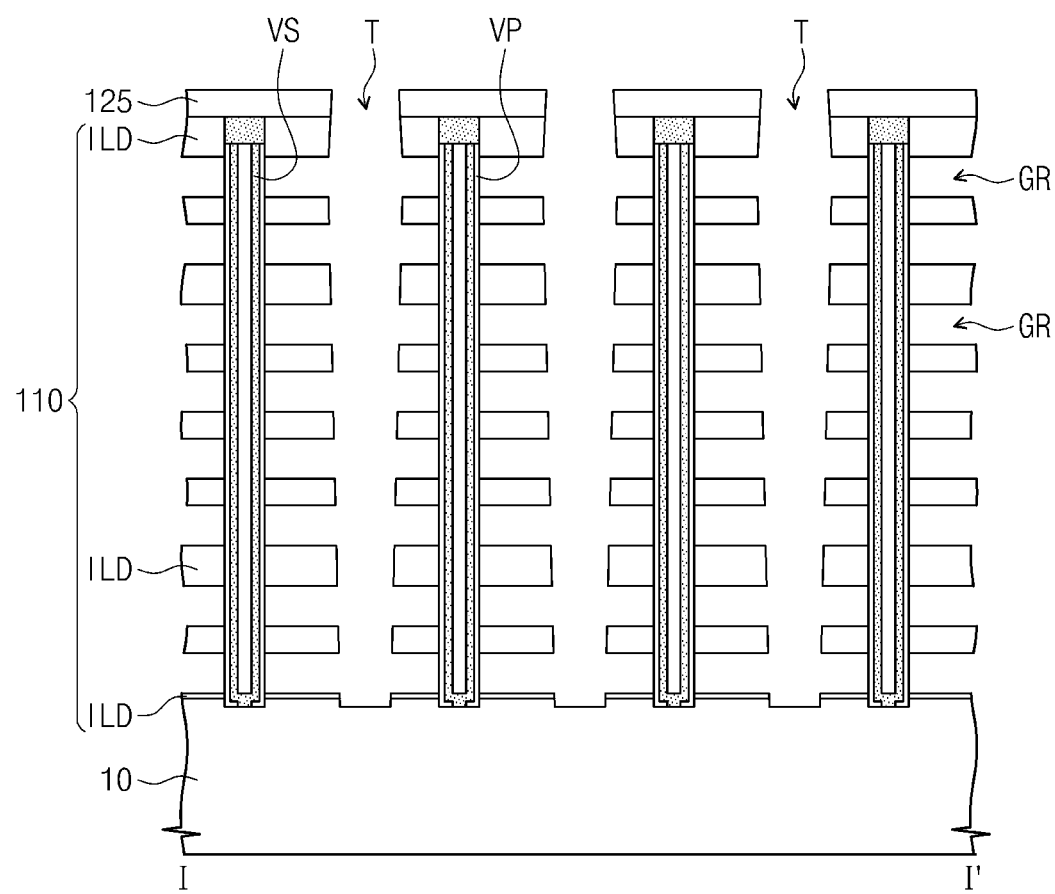

Referring to FIGS. 14 and 18, the sacrificial layers SL exposed by the trenches T may be removed to form gate regions GR between the insulating layers ILD.

The sacrificial layers SL may be isotropically etched using an etch recipe having an etch selectivity with respect to the insulating layers ILD, the vertical structures VS, and the substrate 10 to form the gate regions GR. At this time, the sacrificial layers SL may be completely removed by the isotropic etching process. For example, in the case in which the sacrificial layers SL are silicon nitride layers and the insulating layers ILD are silicon oxide layers, the sacrificial layers SL may be isotropically etched using an etching solution including phosphoric acid. In addition, the vertical insulating pattern VP may be used as an etch stop layer during the isotropic etching process for forming the gate regions GR.

The gate regions GR may laterally extend from the trench T into between the insulating layers ILD and may expose portions of the sidewall of the vertical insulating pattern VP or portions of the sidewall of the vertical structure VS. In other words, each of the gate regions GR may be defined by the sidewall of the vertical insulating pattern VP and the insulating layers ILD vertically adjacent to each other.

Figure 19:
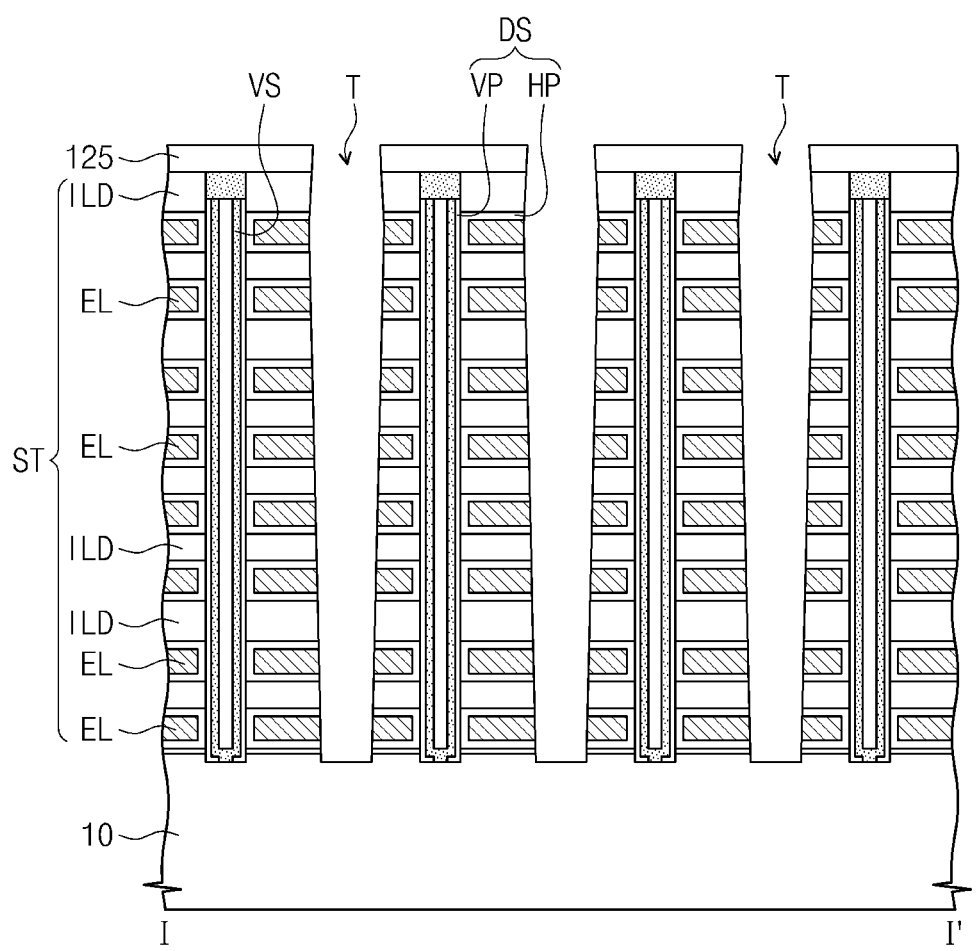

As shown in FIGS. 14 and 19, a horizontal insulating layer may be formed to conformally cover inner surfaces of the gate regions GR.

The horizontal insulating layer may have a substantially uniform thickness on the inner surface of the gate region GR. The horizontal insulating layer may be formed of one thin layer or a plurality of thin layers. In some exemplary implementations, the horizontal insulating layer may be a portion of a data storage layer of a charge trap-type flash memory transistor. Subsequently, a gate conductive layer may be formed to fill the gate regions GR having the horizontal insulating layer. The gate conductive layer may partially or completely fill the trench T. In some exemplary implementations, the gate conductive layer may include a barrier metal layer and a metal layer which are sequentially deposited. For example, the barrier metal layer may include a metal nitride layer such as TiN, TaN, or WN. For example, the metal layer may include a metal material such as W, Al, Ti, Ta, Co, or Cu. Next, the gate conductive layer and the horizontal insulating layer disposed outside the gate regions GR may be removed to confinedly form electrodes EL and horizontal insulating patterns HP in the gate regions GR, respectively.

Since the electrodes EL are formed in the gate regions GR, stack structures ST may be formed on the substrate 10. Each of the stack structures ST may include the insulating layers ILD and the electrodes EL which are alternately and repeatedly stacked on the substrate 10. The stack structures ST may extend in the first direction D1, and sidewalls of the stack structures ST may be exposed through the trenches T. In addition, the substrate 10 may be exposed between the stack structures ST adjacent to each other.

Figure 20:
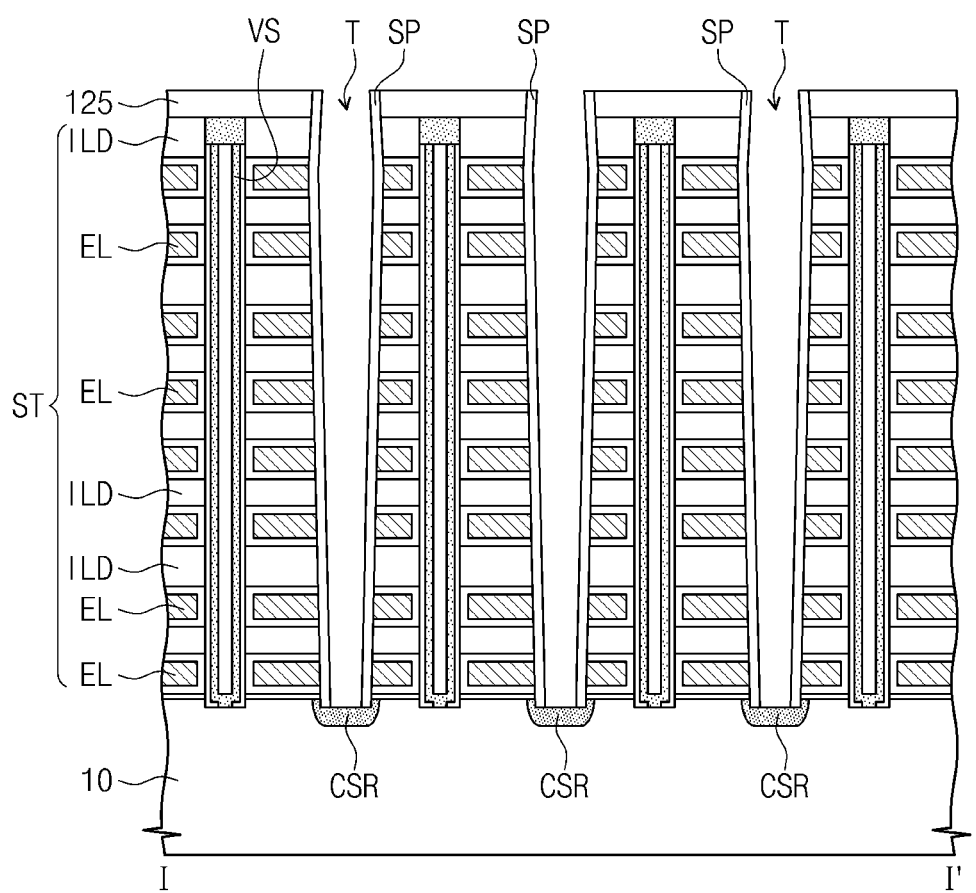

As shown in FIGS. 14 and 20, common source regions CSR may be formed in the substrate 10 under the trenches T between the stack structures ST. The common source regions CSR may extend in parallel along the first direction D1 and may be spaced apart from each other in a second direction D2 intersecting the first direction D1. Dopants may be injected into the substrate 10 to form the common source regions CSR. A conductivity type of the common source regions CSR may be different from that of the substrate 10.

Insulating spacers SP may be formed to cover the sidewalls of the trenches T. Forming the insulating spacers SP may include conformally depositing a spacer layer on the substrate 10 having the stack structures ST, and performing an etch-back process on the spacer layer to expose the common source regions CSR. The spacer layer may be formed of an insulating material, and a thickness of the deposited spacer layer may be less than about a half of the minimum width of the trench T. For example, the spacer layer may be formed of at least one of a silicon oxide layer, a silicon nitride layer, a silicon oxynitride layer, or a low-k dielectric layer having a low dielectric constant.

In some exemplary implementations, a thickness of the insulating spacer SP formed on a sidewall of an upper portion of the stack structure ST may be reduced by the etch-back process performed on the spacer layer. In other words, the thickness of the insulating spacer SP may become progressively less toward the top surface of the uppermost insulating layer ILD.

Figure 21:
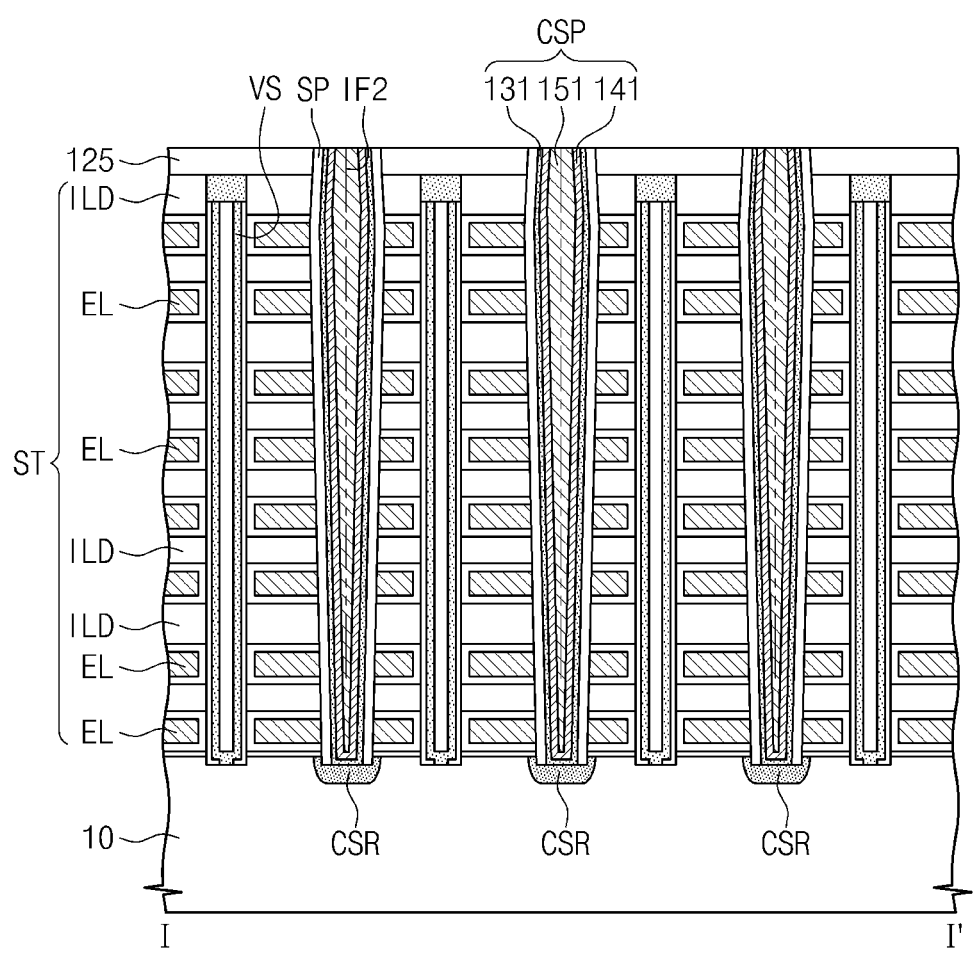

As shown in FIGS. 14 and 21, a common source line structure CSP may be formed in each of the trenches T having the insulating spacers SP.

According to some exemplary implementations, in the 3D semiconductor memory device, the common source line structure CSP may be disposed between the electrodes EL laterally adjacent to each other, and the insulating spacers SP may be disposed between the common source line structure CSP and the electrodes EL, respectively. In other words, the insulating spacers SP may cover sidewalls of the common source line structure CSP.

In some exemplary implementations, the common source line structure CSP may be formed using at least one of the fabrication methods of the semiconductor device, described with reference to FIGS. 1 to 11. In other words, forming the common source line structure CSP may include depositing a first tungsten layer 141 covering inner surfaces of the trenches T, treating a surface of a portion of the first tungsten layer 141, and depositing a second tungsten layer 151 completely filling the trenches T on the first tungsten layer 141.

In more detail, as described with reference to FIG. 2, a barrier metal layer 131 and the first tungsten layer 141 may be sequentially deposited on the inner surfaces of the trenches having the insulating spacers SP. The first tungsten layer 141 may have a thickness smaller than about a half of the minimum width of the trench, and thus, the first tungsten layer 141 may define a recess region in each of the trenches. A depth of the recess region may be greater than about a half of the depth of the trench. In other word, the depth of the recess region may be greater than about a half of a thickness (or a height) of the stack structure ST.

Next, as described with reference to FIGS. 3 and 4, the surface treatment process may be performed on a portion of the surface of the first tungsten layer 141. For example, the plasma treatment process may be performed as the surface treatment process. After the plasma treatment process, the first tungsten layer 141 may have a first surface treated by the plasma treatment process and a second surface not treated by the plasma treatment process. Here, an area of the first surface of the first tungsten layer 141 may be varied depending on the intensity of plasma and/or an aspect ratio of the trench. Meanwhile, instead of the surface treatment process, the metal nitride layer may be deposited on a portion of the first tungsten layer 141, as described with reference to FIG. 10.

Subsequently, as described with reference to FIG. 5, the second tungsten layer 151 may be deposited to completely fill the recess region of the first tungsten layer 141. When the second tungsten layer 151 is deposited, a growth rate (i.e., a deposition rate) and a size of a tungsten grain may be varied according to a surface state of the first tungsten layer 141. In other word, as illustrated in FIGS. 25A and 25B, the grains of the second tungsten layer 151 may be larger than the grains of the first tungsten layer 141 in the upper region of the trench. In addition, as described with reference to FIGS. 8A and 8B, the grains of the second tungsten layer 151 in the upper region of the trench may be larger than the grains of the second tungsten layer 151 in the lower region of the trench. In some exemplary implementations, a thickness t2 of the second tungsten layer 151 may be greater than a thickness t1 of the first tungsten layer 141, as illustrated in FIG. 25A. Alternatively, the thickness t2 of the second tungsten layer 151 may be substantially equal to the thickness t1 of the first tungsten layer 141, as illustrated in FIG. 25B.

As illustrated in FIGS. 25A and 25B, the grains of the second tungsten layer 151 may be laterally grown from sidewalls of the recess region of the first tungsten layer 141, and thus, the common source line structure CSP may have a second interface IF2 formed by the grains of the second tungsten layer 151 in a central region of the common source line structure CSP. In addition, the common source line structure CSP may also have a first interface IF1 formed by a difference in size between the grains of the first tungsten layer 141 and the grains of the second tungsten layer 151.

Figure 22:
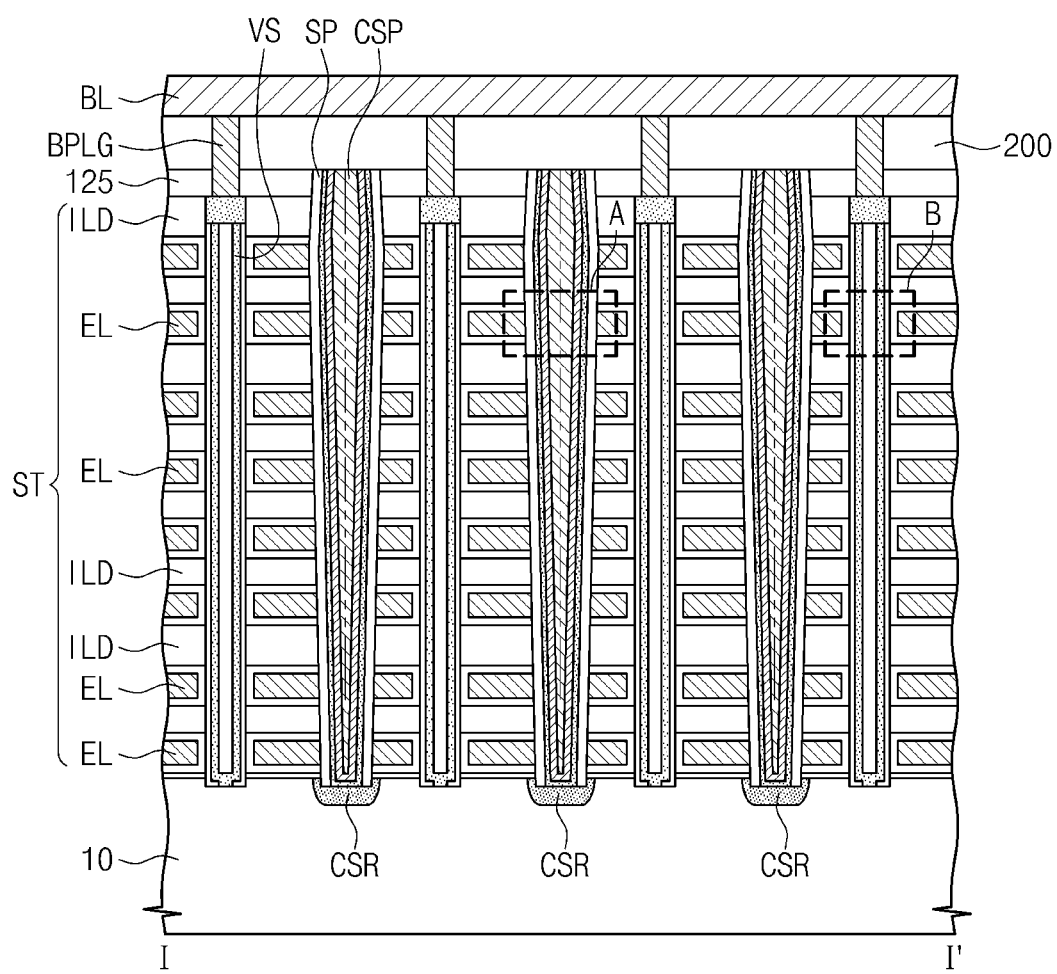
Figure 23:
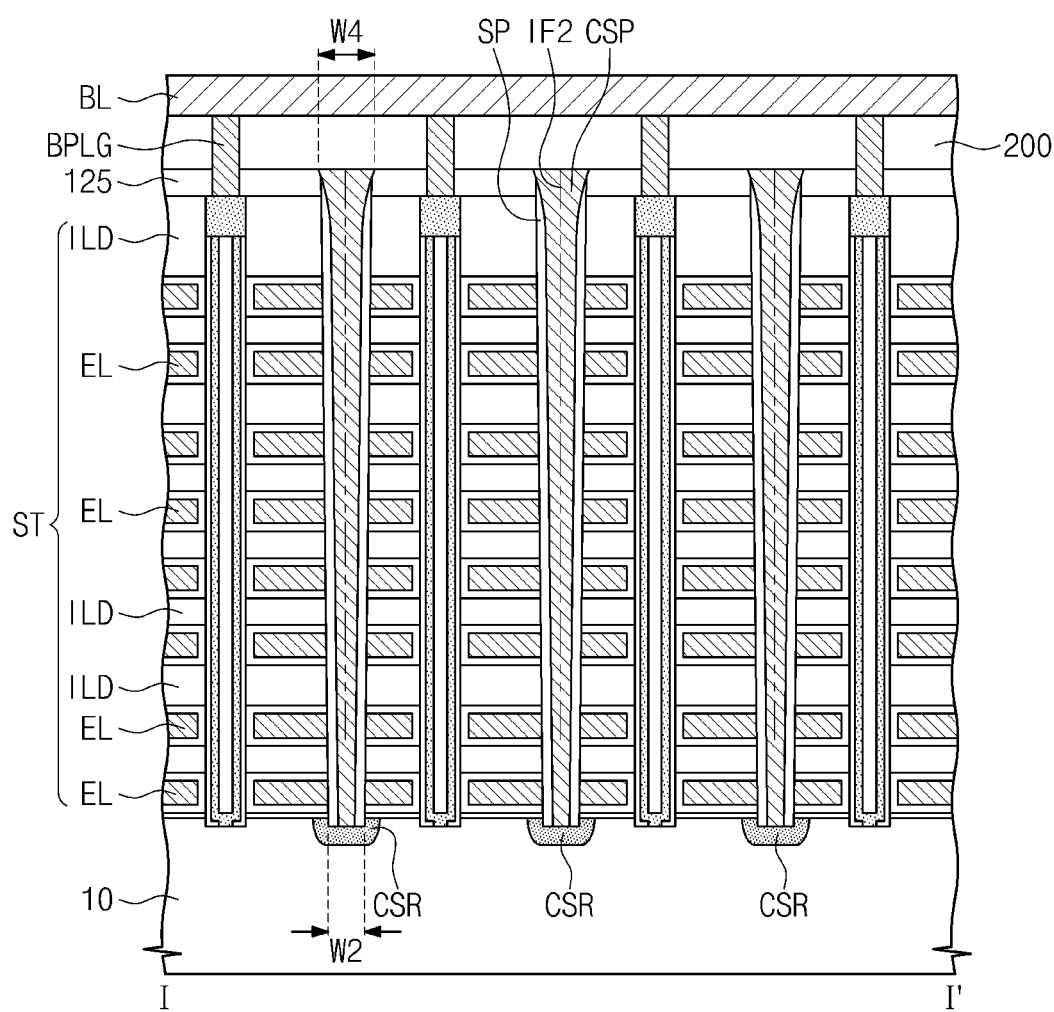

Meanwhile, as illustrated in FIG. 23, since the thickness of the insulating spacer SP adjacent to the upper portion of the stack structure ST becomes progressively less toward the top end of the stack structure ST, the common source line structure CSP may have the maximum width W4 at its top surface. In other word, the common source line structure CSP may include an upper portion adjacent to the uppermost insulating layer ILD, and a width of the upper portion of the common source line structure CSP may become progressively greater toward a top surface of the capping dielectric pattern 125. The common source line structure CSP may have minimum width W2 at its bottom surface. The bottom surface of the common source line structure CSP may be in contact with the common source region CSR. As shown in FIGS. 14 and 22, an upper filling insulation layer 200 covering the top surfaces of the common source line structures CSP may be formed on the stack structures ST.

Bit line contact plugs BPLG may be formed to penetrate the upper filling insulation layer 200 and may be connected to the vertical structures VS, respectively. Next, bit lines BL extending in the second direction D2 may be formed on the upper filling insulation layer 200. The bit lines BL may be connected to the bit line contact plugs BPLG. In addition, a common source line CSL may also be formed on the upper filling insulation layer 200. The common source line CSL may extend in parallel to the bit lines BL along the second direction D2 and may be disposed between the bit lines BL adjacent to each other. The common source line CSL may be electrically connected to the common source line structure CSP through a common source plug CSPLG.

Data storage layers according to exemplary implementations of the inventive concepts will be described in detail with reference to FIGS. 26A to 26D.

According to exemplary implementations of the inventive concepts, the 3D semiconductor memory device may be a NAND flash memory device. For example, the data storage layer DS between the vertical structure VS and the stack structure ST may include a tunnel insulating layer TIL, a charge storage layer CIL, and a blocking insulating layer BK. Data stored in the data storage layer DS may be changed using the Flower-Nordheim tunneling phenomenon caused by a difference in voltage between the electrode EL and the vertical structure VS including the semiconductor material.

Figure 26A:
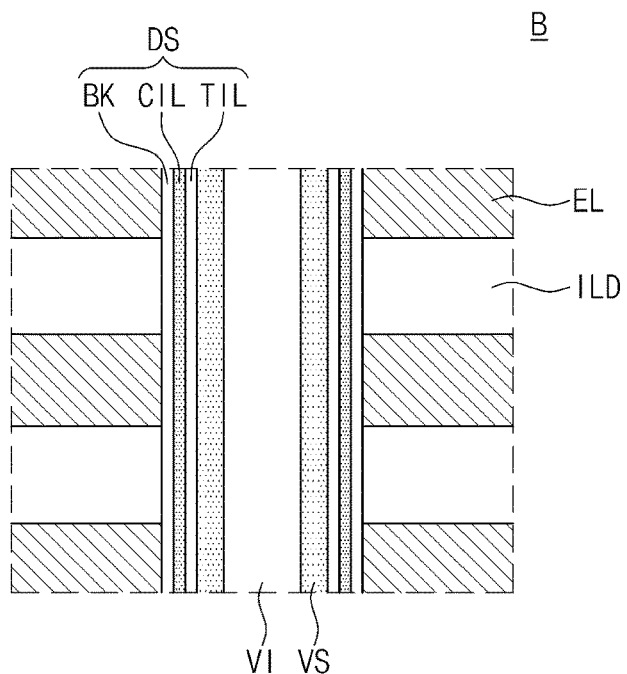
FIGS. 26A, 26B, 26C, and 26D are enlarged views of a portion 'B' of FIG. 22.

According to the exemplary implementation illustrated in FIG. 26A, the tunnel insulating layer TIL, the charge storage layer CIL, and the blocking insulating layer BK may extend from between the electrode EL and the vertical structure VS into between the insulating layer ILD and the vertical structure VS.

Figure 26B:
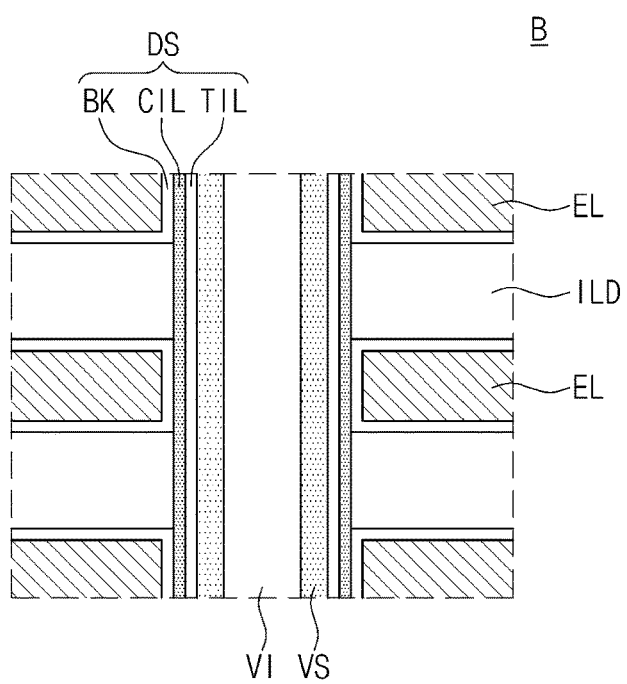

According to the exemplary implementation illustrated in FIG. 26B, the tunnel insulating layer TIL and the charge storage layer CIL may extend from between the electrode EL and the vertical structure VS into between the insulating layer ILD and the vertical structure VS. The blocking insulating layer BK may extend from between the electrode EL and the vertical structure VS onto top and bottom surfaces of the electrode EL.

Figure 26C:
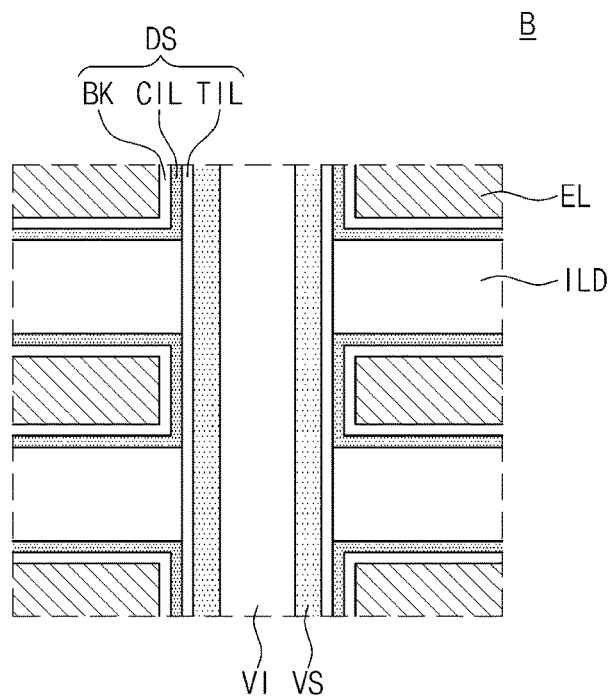

According to the exemplary implementation illustrated in FIG. 26C, the tunnel insulating layer TIL may extend from between the electrode EL and the vertical structure VS into between the insulating layer ILD and the vertical structure VS. The charge storage layer CIL and the blocking insulating layer BK may extend from between the electrode EL and the vertical structure VS onto the top and bottom surfaces of the electrode EL.

Figure 26D:
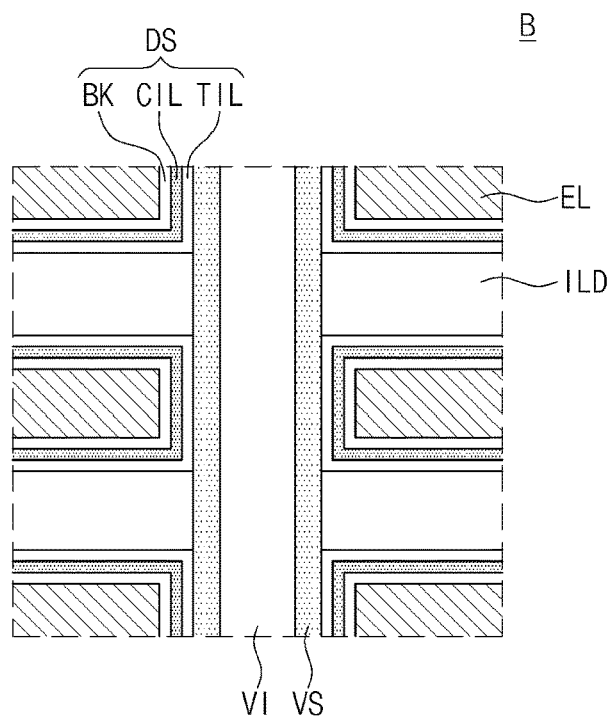

According to the exemplary implementation illustrated in FIG. 26D, the tunnel insulating layer TIL, the charge storage layer CIL, and the blocking insulating layer BK may extend from between the electrode EL and the vertical structure VS onto the top and bottom surfaces of the electrode EL.

In the data storage layer DS, the charge storage layer CIL may include at least one selected from a group consisting of trap site-rich insulating layers and insulating layers including nano particles and may be formed using a CVD technique or an ALD technique. For example, the charge storage layer CIL may include at least one of a trap insulating layer, a floating gate electrode, or an insulating layer including conductive nano dots. In more detail, the charge storage layer CIL may include at least one of, but not limited to, a silicon nitride layer, a silicon oxynitride layer, a silicon-rich nitride layer, a nano-crystalline silicon layer, or a laminated trap layer.

The tunnel insulating layer TIL may include at least one of materials having energy band gaps greater than that of the charge storage layer CIL and may be formed by a CVD technique or an ALD technique. For example, the tunnel insulating layer TIL may include a silicon oxide layer formed using the CVD technique or the ALD technique. Alternatively, the tunnel insulating layer TIL may include at least one of the high-k dielectric layers such as an aluminum oxide layer and hafnium oxide layer.

The blocking insulating layer BK may include first and second blocking insulating layers that are formed of different materials from each other. One of the first and second blocking insulating layers may include a material of which an energy band gap is smaller than that of the tunnel insulating layer TIL and greater than that of the charge storage layer CIL. The first and second blocking insulating layers may be formed by a CVD technique or an ALD technique. In some exemplary implementations, at least one of the first and second blocking insulating layers may be formed by a wet oxidation process. In some exemplary implementations, the first blocking insulating layer may include at least one of high-k dielectric layers such as an aluminum oxide layer and a hafnium oxide layer, and the second blocking insulating layer may include a material of which a dielectric constant is lower than that of the first blocking insulating layer. In some exemplary implementations, the second blocking insulating layer may include at least one of the high-k dielectric layers, and the first blocking insulating layer may include a material of which a dielectric constant is lower than that of the second blocking insulating layer.

Figure 27:
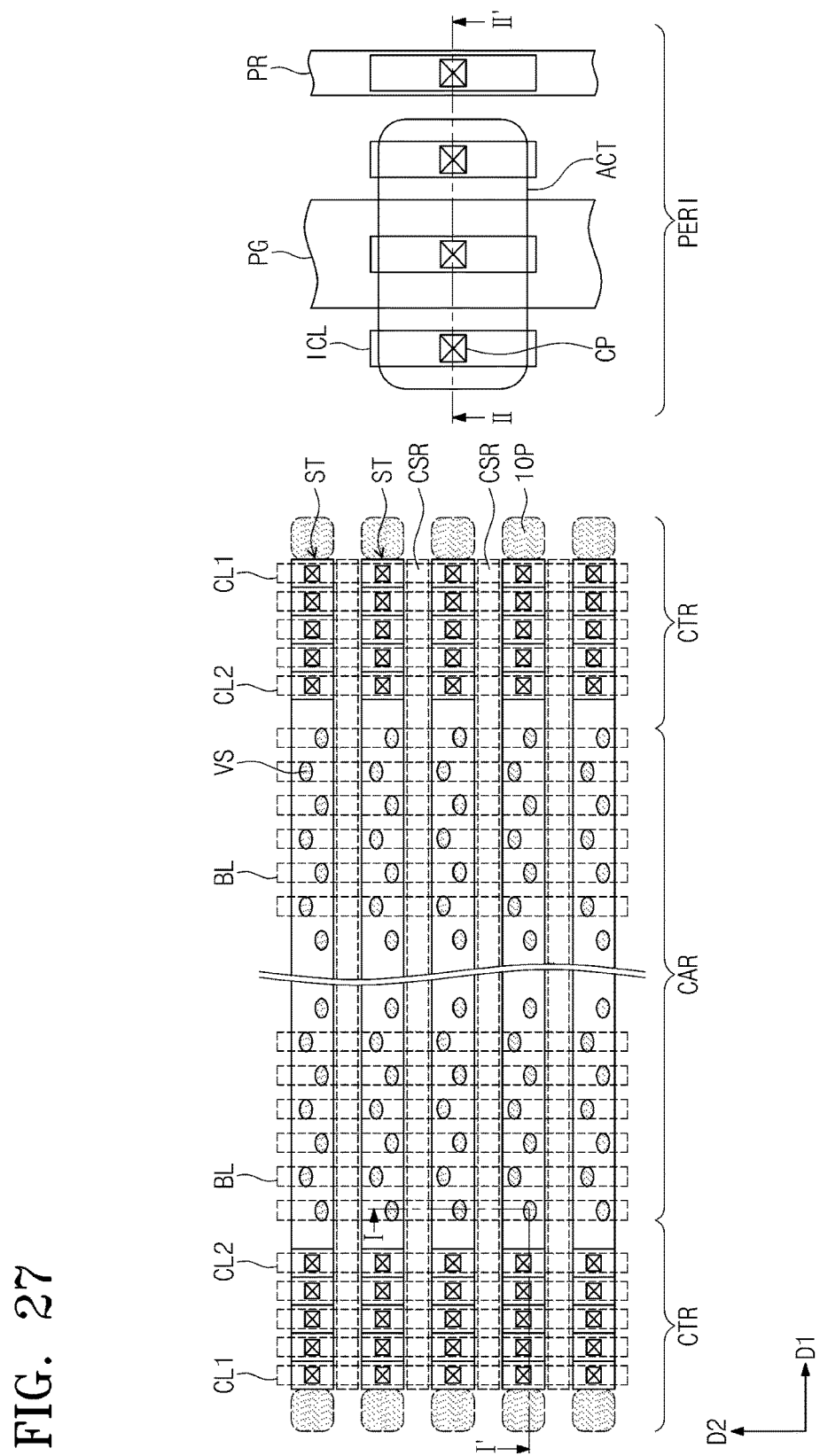
FIG. 27 is a plan view illustrating a 3D semiconductor memory device according to some exemplary implementations of the disclosed subject matter.
Figure 28:
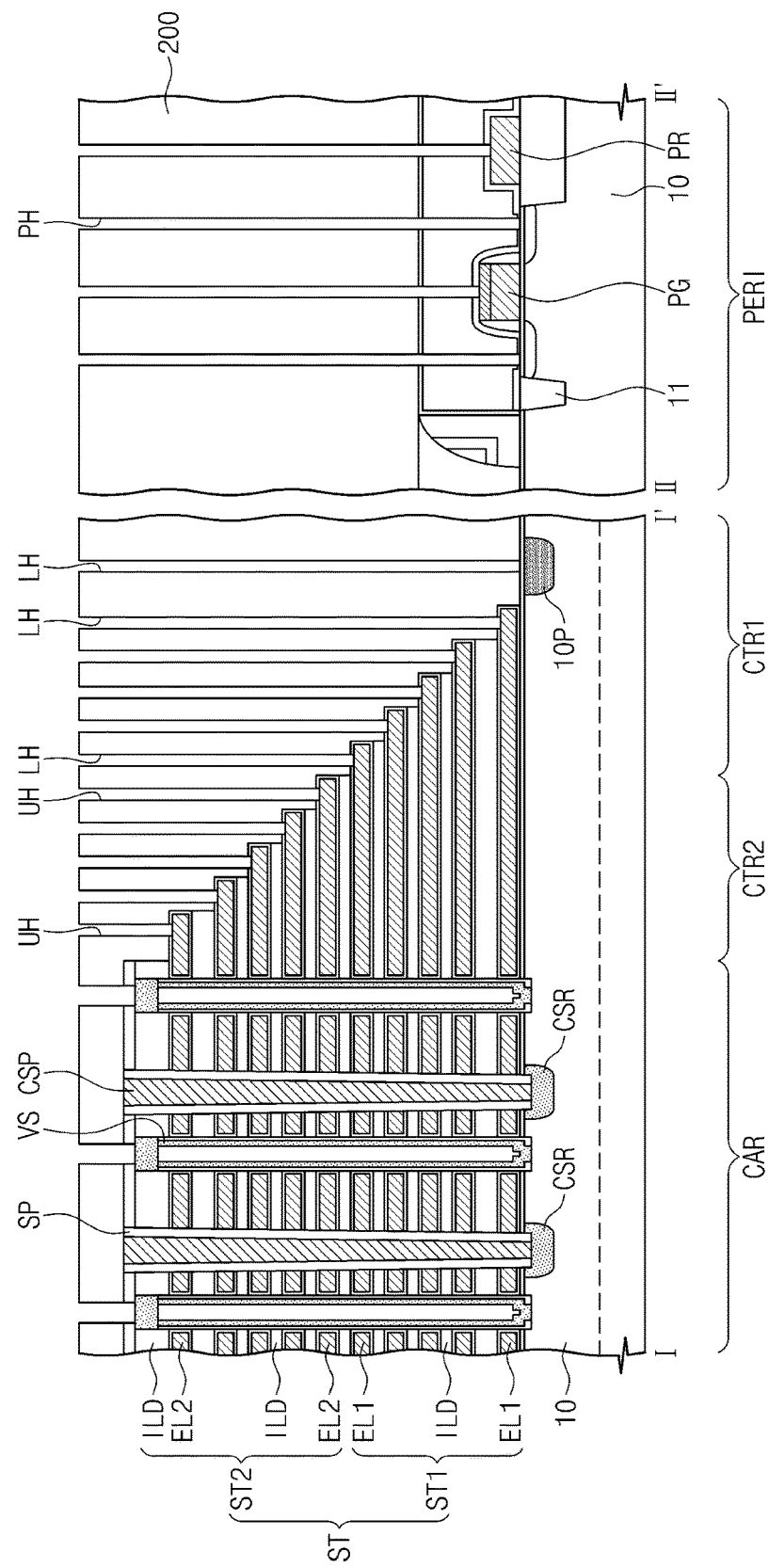
FIGS. 28 and 29 are cross-sectional views taken along lines I-I' and II-II' of FIG. 27 to illustrate a method for fabricating a 3D semiconductor memory device according to some exemplary implementations of the disclosed subject matter.
Figure 29:
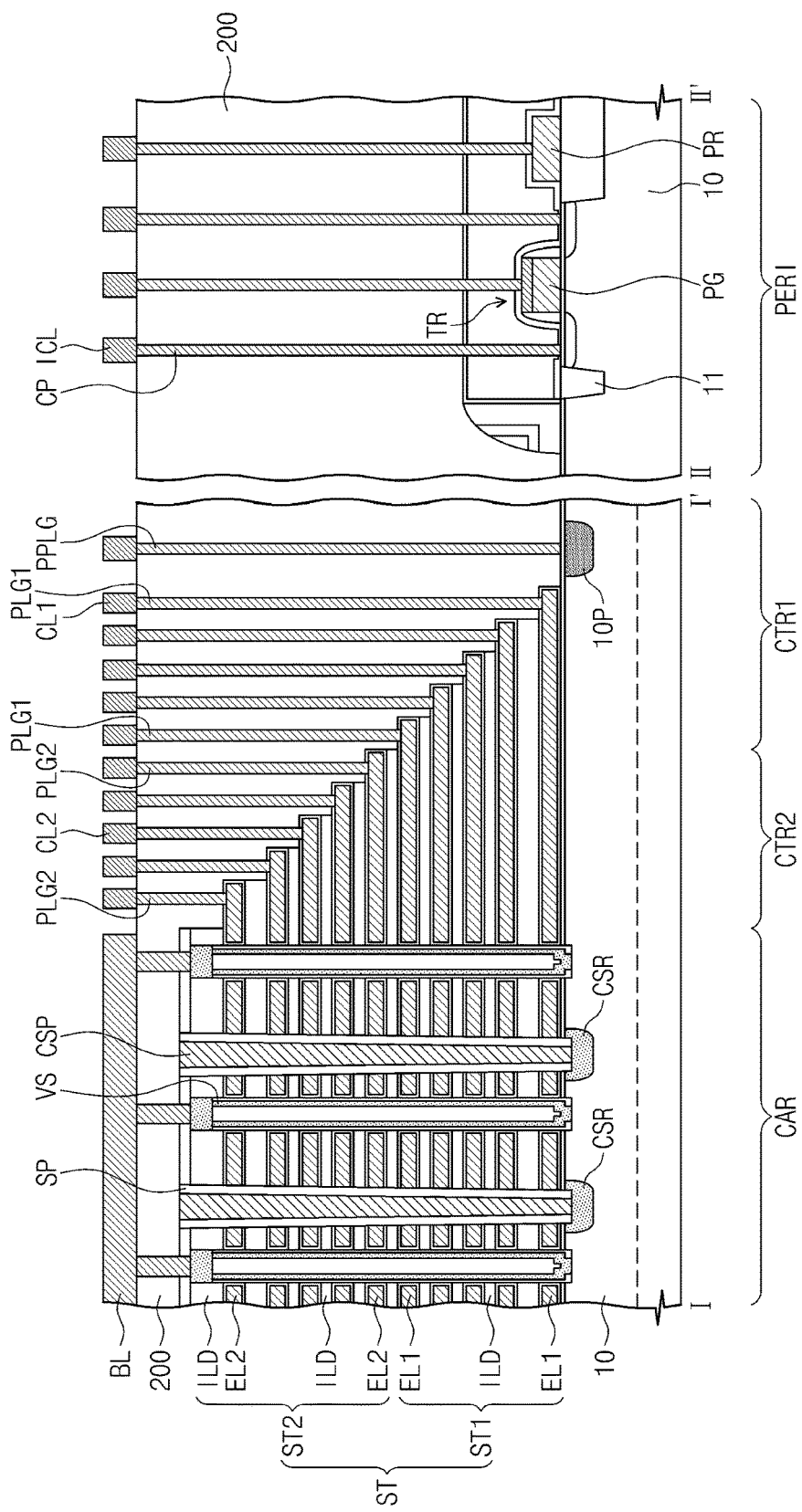
Figure 30:
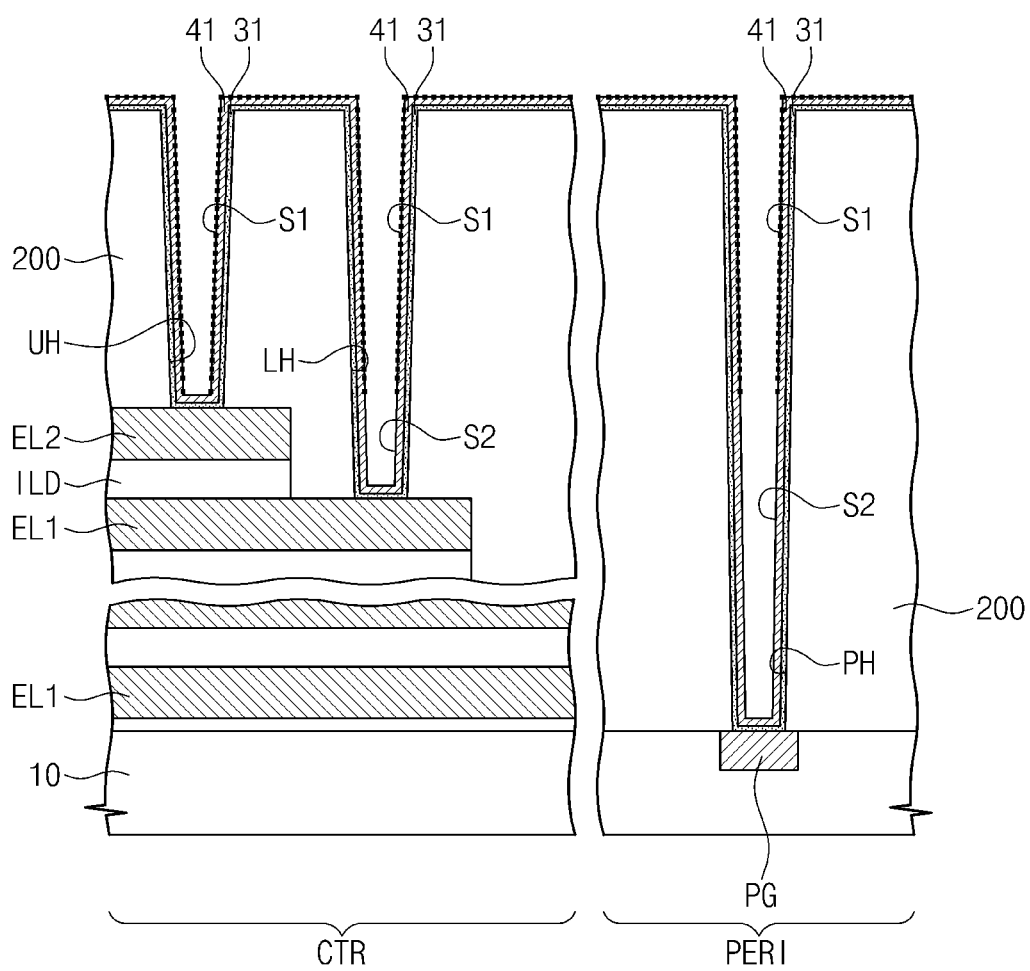
FIGS. 30 and 31 are enlarged cross-sectional views illustrating a method for fabricating the 3D semiconductor memory device of FIG. 29 in detail.
Figure 31:
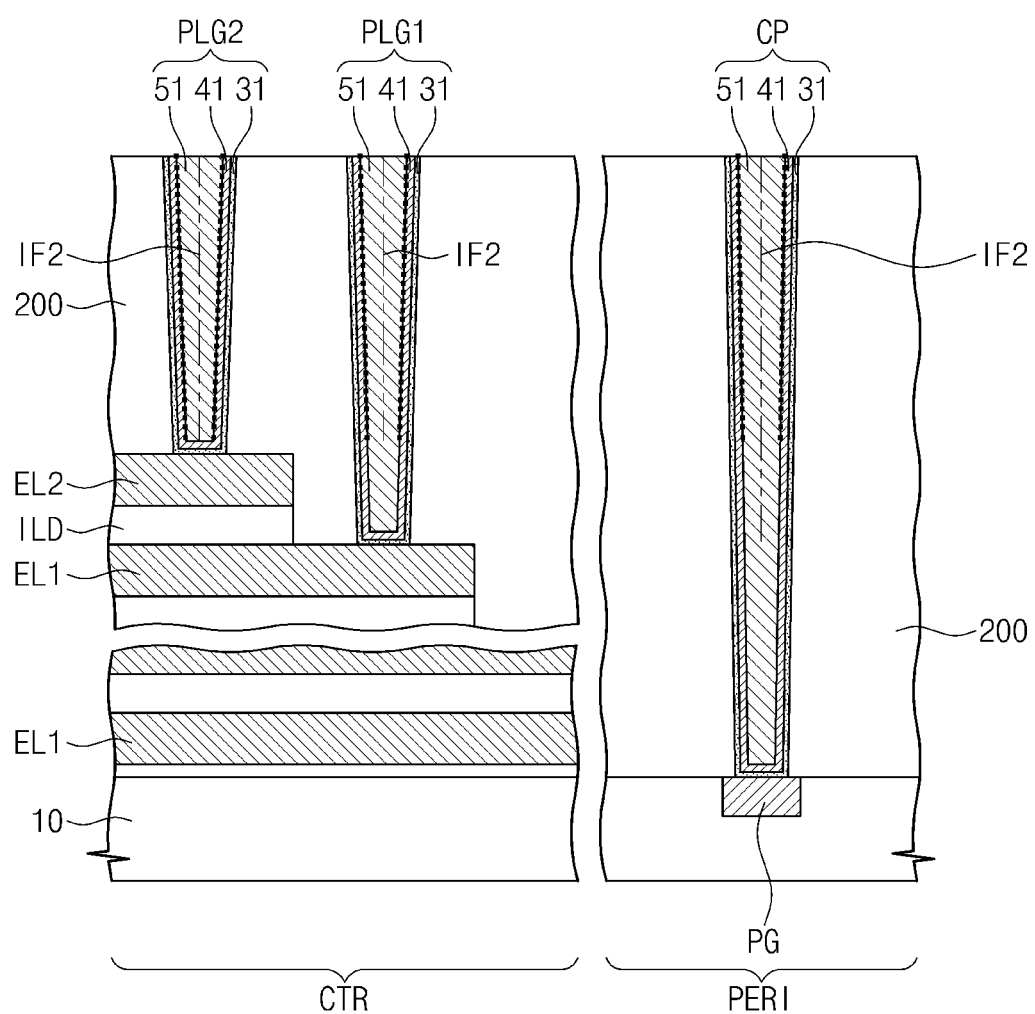

FIG. 27 is a plan view illustrating a 3D semiconductor memory device according to some exemplary implementations of the inventive concepts. FIGS. 28 and 29 are cross-sectional views taken along lines I-I' and II-II' of FIG. 27 to illustrate a method for fabricating a 3D semiconductor memory device according to some exemplary implementations of the inventive concepts. FIGS. 30 and 31 are enlarged cross-sectional views of a portion of the 3D semiconductor memory device to illustrate a method for fabricating the 3D semiconductor memory device. In the present exemplary implementation, the descriptions to the same technical features as in the exemplary implementations of FIGS. 14 to 24 will be omitted or mentioned briefly for the purpose of ease and convenience in explanation.

Referring to FIGS. 27 and 28, a substrate 10 may include a cell array region CAR, a peripheral circuit region PERI, and a contact region CTR between the cell array region CAR and the peripheral circuit region PERI. In some exemplary implementations, the contact region CTR may include a first contact region CTR1 adjacent to the peripheral circuit region PERI and a second contact region CTR2 adjacent to the cell array region CAR. The substrate 10 of the peripheral circuit region PERI may include an active region ACT defined by a device isolation layer 11.

The substrate 10 may include a material having semiconductor properties (e.g., a silicon wafer), an insulating material (e.g., glass), or a semiconductor or conductor covered with an insulating material. In some exemplary implementations, the substrate 10 may be a silicon wafer having a first conductivity type.

In some exemplary implementations, a cell array structure may be disposed on the substrate of the cell array region CAR, and a peripheral logic structure may be disposed on the substrate 10 of the peripheral circuit region PERI. The cell array structure may have a first height from a top surface of the substrate 10, and the peripheral logic structure may have a second height from the top surface of the substrate 10. The second height may be smaller than the first height.

Pickup regions 10P may be disposed in the substrate 10 and may be adjacent to the cell array structure. The pickup regions 10P may be disposed to be adjacent to both ends of each of stack structures ST included in the cell array structure when viewed from a plan view. In other word, the pickup regions 10P may be spaced apart from each other in a first direction D1 when viewed from a plan view. The pickup regions 10P may be doped with dopants having the same conductivity type as the substrate 10.

In some exemplary implementations, the peripheral logic structure of the peripheral circuit region PERI may include the low and column decoders 2 and 4 of FIG. 12, the page buffer 3 of FIG. 12, and the control circuit 5 of FIG. 12. In other word, the peripheral logic structure may include NMOS and PMOS transistors, a resistor, and a capacitor which are electrically connected to the cell array structure.

In more detail, the active region ACT may be defined by the device isolation layer 11 formed in the substrate 10 of the peripheral circuit region PERI. A peripheral gate electrode PG may be disposed on the active region ACT in the peripheral circuit region PERI, and source/drain dopant regions may be formed in the active region ACT at both sides of the peripheral gate electrode PG. A gate insulating layer may be disposed between the peripheral gate electrode PG and the active region ACT. In addition, a resistor pattern PR may be disposed on the substrate of the peripheral circuit region PERI.

The peripheral gate electrode PG may be formed of poly-silicon doped with dopants or may be formed of a conductive material of which a work function is higher than that of the poly-silicon doped with dopants. For example, the conductive material having the high work function may include at least one of a metal (e.g., molybdenum) or a conductive metal nitride (e.g., titanium nitride, tantalum nitride, tungsten nitride, or titanium-aluminum nitride). The gate insulating layer may include at least one of an oxide, a nitride, an oxynitride, or a high-k dielectric material (e.g., an insulating metal oxide such as hafnium oxide or aluminum oxide). A conductivity type of the source/drain dopant regions may be different from that of the active region ACT.

In some exemplary implementations, the cell array structure may include the stack structures ST and the vertical structures VS described with reference to FIGS. 15 to 26. The vertical structures VS may penetrate the stack structures ST. In some exemplary implementations, the stack structure ST may include a first stack structure ST1 including a plurality of first electrodes EL1 vertically stacked on the substrate 10 and a second stack structure ST2 including a plurality of second electrodes EL2 vertically stacked on the first stack structure ST1. Insulating layers ILD may be disposed between the first electrodes EL1 and between the second electrodes EL2.

The stack structures ST may extend from the cell array region CAR into the contact region CTR. The stack structure ST may have a stepwise structure in the contact region CTR to electrically connect the electrodes EL1 and EL2 to the peripheral logic structure. In other word, a vertical height of the stack structure ST in the contact region CTR may increase as a distance from the cell array region CAR decreases. That is, the stack structure ST may have a sloped profile in the contact region CTR.

In more detail, end portions of the first electrodes EL1 may be disposed on the substrate 10 of the first contact region CTR1, and the first stack structure ST1 may have a stepwise structure in the first contact region CTR1. Areas of the first electrodes EL1 may decrease as a vertical distance from the top surface of the substrate 10 increases. End portions of the second electrodes EL2 may be disposed on the substrate 10 of the second contact region CTR2, and the second stack structure ST2 may have a stepwise structure in the second contact region CTR2. Here, the maximum length of the second electrodes EL2 may be smaller than the minimum length of the first electrodes EL1. Areas of the second electrodes EL2 may decrease as a vertical distance from the top surface of the substrate 10 increases.

In some exemplary implementations, the vertical structures VS may penetrate the stack structures ST so as to be connected to the substrate 10. The vertical structures VS may include a semiconductor material and a conductive material. In an exemplary implementation, the vertical structures VS penetrating one stack structure ST may be arranged in a line when viewed from a plan view. In an exemplary implementation, the vertical structures VS penetrating one stack structure ST may be arranged in a zigzag form when viewed from a plan view.

As described with reference to FIGS. 19 to 22, the insulating spacers SP and the common source line structure CSP may be disposed between the stack structures ST extending in a first direction D1. In other word, the insulating spacers SP and the common source line structure CSP may extend in the first direction D1.

In some exemplary implementations, an upper filling insulation layer 200 may be formed on an entire top surface of the substrate 10 in such a way to cover the stack structures ST and the peripheral logic structure. The upper filling insulation layer 200 may have a planarized top surface and may cover the end portions of the stack structures ST. The upper filling insulation layer 200 may include one insulating layer or a plurality of stack insulating layers.

At least one patterning process may be performed on the upper filling insulation layer 200 to form lower contact holes LH of the first contact region CTR1, upper contact holes UH of the second contact region CTR2, and peripheral contact holes PH of the peripheral circuit region PERI. The lower contact holes LH may expose portions of the first electrodes EL1, respectively, and the upper contact holes UH may expose portions of the second electrodes EL2, respectively. In some exemplary implementations, the upper contact holes UH may be formed before the formation of the lower contact holes LH and the peripheral contact holes PH. Since the stack structure ST has the stepwise structure, the upper and lower contact holes UH and LH may locally expose the electrodes EL1 and EL2 disposed at heights different from each other. In other word, depths of the upper and lower contact holes UH and LH may be different from each other.

The peripheral contact holes PH may penetrate the upper filling insulation layer 200 to expose portions of the peripheral logic structure. The peripheral contact holes PH may locally expose the source/drain dopant region, the peripheral gate electrode PG, and/or the resistor pattern PR.

In addition, each of the lower, upper and peripheral contact holes UH, LH and PH may include an upper region, a lower region, and a bowing region between the upper and lower regions, like the opening 25 described with reference to FIG. 1. Each of the lower, upper and peripheral contact holes UH, LH and PH may have the maximum width in its bowing region.

As shown in FIG. 29, first contact plugs PLG1 may be formed in the lower contact holes LH, and second contact plugs PLG2 may be formed in the upper contact holes UH. At the same time, peripheral contact plugs CP may be formed in the peripheral contact holes PH of the peripheral circuit region PERI.

Forming the first and second contact plugs PLG1 and PLG2 and the peripheral contact plugs CP may include forming a conductive layer filling the upper and lower contact holes and the peripheral contact holes, and performing a planarization process on the conductive layer until a top surface of the upper filling insulation layer 200 is exposed. Thus, top surfaces of the first and second contact plugs PLG1 and PLG2 may be substantially coplanar with top surfaces of the peripheral contact plugs CP.

In some exemplary implementations, forming the conductive layer filling the upper, lower and peripheral contact holes UH, LH and PH may include depositing a first tungsten layer 41 covering inner surfaces of the contact holes UH, LH and PH, performing the surface treatment process on a portion of the surface of the first tungsten layer 41, and depositing a second tungsten layer 51 completely filling the contact holes UH, LH and PH on the first tungsten layer 41, as described with reference to FIGS. 1 to 11.

In more detail, as illustrated in FIG. 30, a barrier metal layer 31 and the first tungsten layer 41 may be sequentially deposited in the upper, lower and peripheral contact holes UH, LH and PH. At this time, the first tungsten layer 41 may define a recess region in each of the contact holes UH, LH and PH.

Next, as described with reference to FIGS. 3 and 4, the surface treatment process may be performed on a portion of the first tungsten layer 41. In some exemplary implementations, the plasma treatment process as a surface treatment process may be performed on the portion of the first tungsten layer 41. In certain exemplary implementations, instead of the surface treatment process, the metal nitride layer may be deposited on portions of the first tungsten layer 41 formed in the upper regions of the contact holes UH, LH and PH, as described with reference to FIG. 10.

In some exemplary implementations, the surface treatment process may be performed on the first tungsten layer 41 formed in the contact holes UH, LH and PH having different vertical depths at the same time. Thus, as illustrated in FIG. 30, areas of the second surfaces S2 respectively disposed in the upper, lower and peripheral contact holes UH, LH and PH may be different from each other. The second surfaces S2 correspond to surfaces of the first tungsten layer 41 which are not treated by the surface treatment process, as described above. For example, since the plasma is supplied downward to the upper regions of the contact holes UH, LH and PH during the plasma treatment process, plasma-reaching depths of the contact holes UH, LH and PH may be substantially equal to each other even though the depths of the contact holes UH, LH and PH are different from each other. Thus, areas of the first surfaces S1 respectively disposed in the upper, lower and peripheral contact holes UH, LH and PH may be substantially similar to each other. The first surfaces S1 correspond to surfaces of the first tungsten layer 41 which are treated by the surface treatment process.

Subsequently, as illustrated in FIG. 31, the second tungsten layer 51 may be deposited to fill the recess regions of the first tungsten layer 41. When the second tungsten layer 51 is deposited, a growth rate (i.e., a deposition rate) and a size of a tungsten grain may be varied according to a surface state of the first tungsten layer 41. In other word, the grains of the second tungsten layer 51 deposited on the first surface S1, treated by the plasma, of the first tungsten layer 41 may be larger than the grains of the first tungsten layer 41. The grains of the second tungsten layer 51 may be laterally grown from sidewalls of the recess region of the first tungsten layer 41. The laterally grown grains of the second tungsten layer 51 may come in contact with each other to form the second interfaces IF2 in central regions of the first and second contact plugs PLG1 and PLG2 and the peripheral contact plugs CP.

In some exemplary implementations, grain sizes of the second tungsten layer 51 of an upper portion of the second contact plug PLG2 filling one of the upper contact holes UH may be substantially equal to those of the second tungsten layer 51 of a lower portion of the second contact plug PLG2 filling the one upper contact hole UH, as described with reference to FIGS. 8A and 8C. Grain sizes of the second tungsten layer 51 of an upper portion of the first contact plug PLG1 filling one of the lower contact holes LH may be greater than those of the second tungsten layer 51 of a lower portion of the first contact plug PLG1 filling the one lower contact hole LH, as described with reference to FIGS. 8A and 8B. Grain sizes of the second tungsten layer 51 of an upper portion of the peripheral contact plug CP filling one of the peripheral contact holes PH may be greater than those of the second tungsten layer 51 of a lower portion of the peripheral contact plug CP filling the one peripheral contact hole PH, as described with reference to FIGS. 8A and 8C.

As shown in FIGS. 27 and 29, subsequently, bit lines BL may be formed to intersect the stack structures ST in the cell array region CAR. The bit lines BL may extend in the second direction D2. The bit lines BL may be electrically connected to the vertical structures VS through bit line contact plugs BPLG. First connection lines CL1 may be formed in the first contact region CTR1, and second connection lines CL2 may be formed in the second contact region CTR2. A plurality of peripheral circuit interconnections ICL may be formed on the upper filling insulation layer 200 of the peripheral circuit region PERI. The peripheral circuit interconnections ICL may extend from the peripheral circuit region PERI into the cell array region CAR. In some exemplary implementations, the peripheral circuit interconnections ICL may electrically connect peripheral logic circuits of the peripheral circuit region PERI to memory cells of the cell array region CAR. Each of the peripheral circuit interconnections ICL may be electrically connected to one of the peripheral contact plugs CP. In some exemplary implementations, a conductive layer may be deposited on the upper filling insulation layer 200, and the deposited conductive layer may be patterned to form the bit lines BL, the first and second connection lines CL1 and CL2, and the peripheral circuit interconnections ICL.

Figure 32:
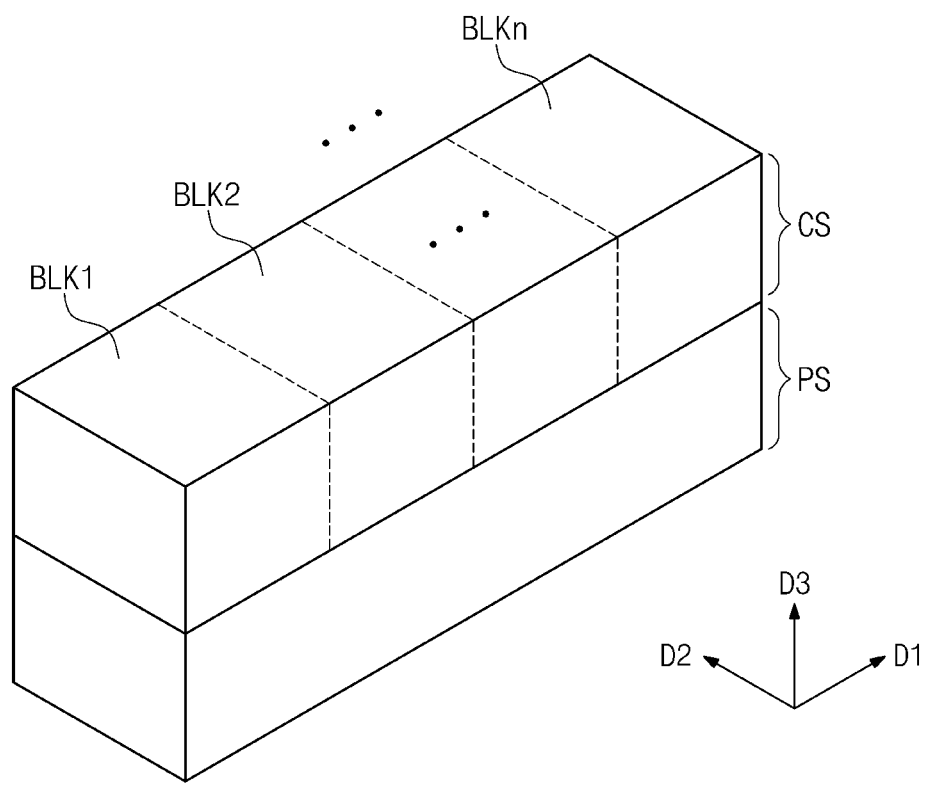
FIG. 32 is a schematic block diagram illustrating a 3D semiconductor memory device according to some exemplary implementations of the disclosed subject matter.

FIG. 32 is a schematic block diagram illustrating a 3D semiconductor memory device according to some exemplary implementations of the inventive concepts.

As shown in FIG. 32, a 3D semiconductor memory device according to exemplary implementations may include a peripheral logic structure PS and a cell array structure CS. The cell array structure CS may be stacked on the peripheral logic structure PS. In other word, the cell array structure CS may overlap with the peripheral logic structure PS when viewed from a plan view.

In some exemplary implementations, the peripheral logic structure PS may include the row and column decoders 2 and 4, the page buffer 3, and the control circuit 5 described with reference to FIG. 1. The cell array structure CS may include memory blocks BLK1 to BLKn of which each corresponds to a data erase unit. Each of the memory blocks BLK1 to BLKn may include a structure which is stacked on a plane defined by first and second directions D1 and D2 and extends along a third direction D3. Each of the memory blocks BLK1 to BLKn may include a memory cell array having a 3D structure (or a vertical structure). The memory cell array may include the plurality of three-dimensionally arranged memory cells and the word and bit lines electrically connected to the memory cells, which are described with reference to FIG. 13.

Figure 33:
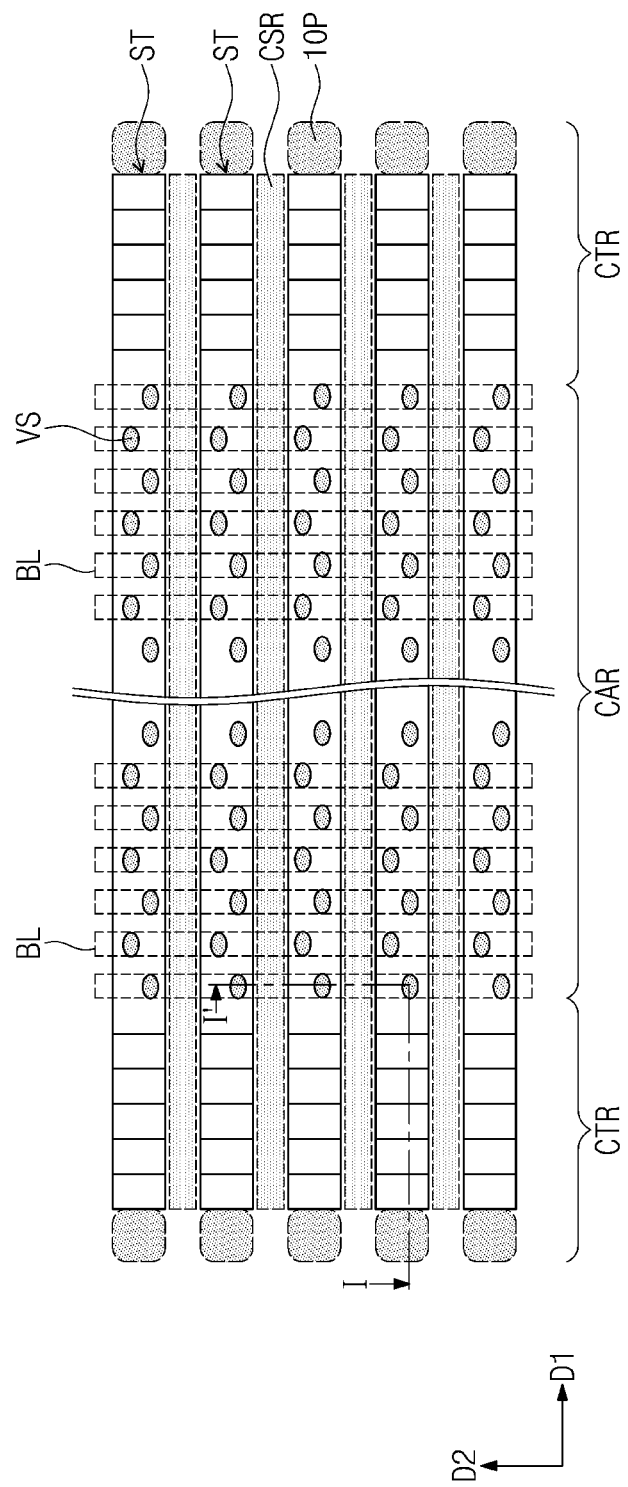
FIG. 33 is a plan view illustrating a 3D semiconductor memory device according to some exemplary implementations of the disclosed subject matter.
Figure 34:
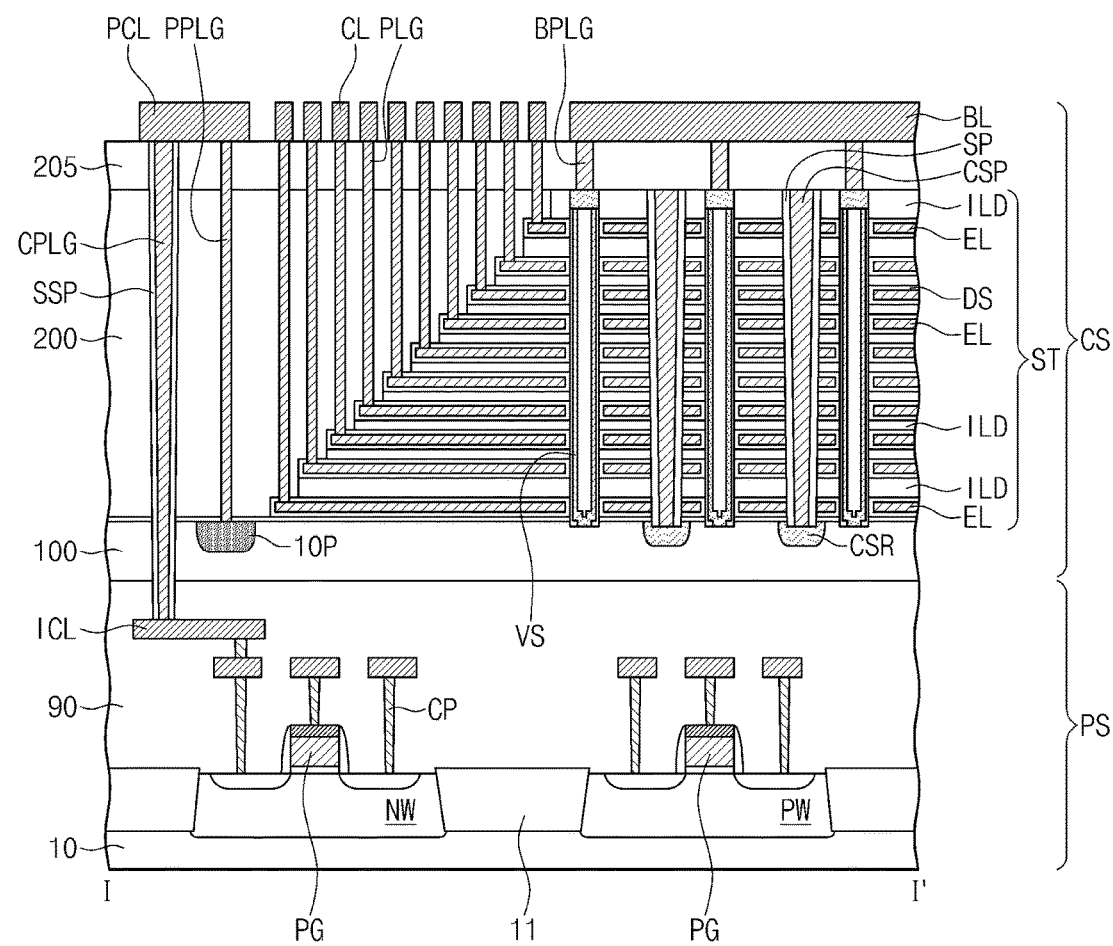
FIG. 34 is a cross-sectional view taken along a line I-I' of FIG. 33.
Figure 35:
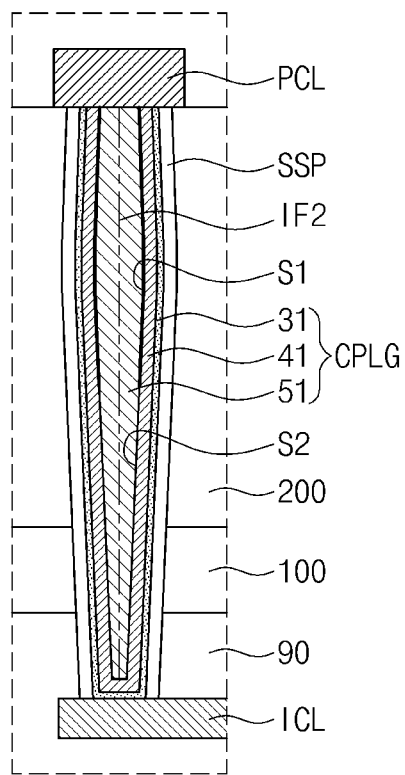
FIG. 35 is an enlarged cross-sectional view illustrating a connection plug of FIG. 34.

FIG. 33 is a plan view illustrating a 3D semiconductor memory device according to some exemplary implementations of the inventive concepts. FIG. 34 is a cross-sectional view taken along a line I-I' of FIG. 33. FIG. 35 is an enlarged cross-sectional view illustrating a connection plug of FIG. 34. In the present exemplary implementation, the descriptions to the same technical features as in the exemplary implementations of FIGS. 15 to 27 will be omitted or mentioned briefly for the purpose of ease and convenience in explanation.

As shown in FIGS. 33 and 34, the peripheral logic structure PS and the cell array structure CS may be sequentially stacked on a substrate 10. In other word, the peripheral logic structure PS may be disposed between the substrate 10 and the cell array structure CS. The peripheral logic structure PS may overlap with the cell array structure CS when viewed from a plan view.

The peripheral logic structure PS may include the row and column decoders 2 and 4, the page buffer 3, and the control circuit 5 of FIG. 12. In other words, the peripheral logic structure PS may include NMOS and PMOS transistors, a resistor and a capacitor which are electrically connected to the cell array structure CS. These peripheral circuits of the peripheral logic structure PS may be formed on an entire top surface of the substrate 10. In addition, the substrate 10 may include an N-well region NW doped with N-type dopants and a P-well region PW doped with P-type dopants. Active regions may be defined in the N-well region NW and the P-well region PW by a device isolation layer 11.

The peripheral logic structure PS may include peripheral gate electrodes PG, source/drain regions at both sides of each of the peripheral gate electrodes PG, peripheral contact plugs CP, peripheral circuit interconnections ICL, and a lower filling insulation layer 90 covering the peripheral circuits. In detail, PMOS transistors may be formed on the N-well region NW, and NMOS transistors may be formed on the P-well region PW. The peripheral circuit interconnections ICL may be electrically connected to the peripheral circuits through the peripheral contact plugs CP. For example, the peripheral contact plugs CP and the peripheral circuit interconnections ICL may be electrically connected to the NMOS and PMOS transistors.

The lower filling insulation layer 90 may cover the peripheral circuits, the peripheral contact plugs CP, and the peripheral circuit interconnections ICL. The lower filling insulation layer 90 may include a plurality of stacked insulating layers.

The cell array structure CS may be disposed on the lower filling insulation layer 90 and may include a horizontal semiconductor layer 100, stack structures ST, and vertical structures VS.

The horizontal semiconductor layer 100 may be formed on the lower filling insulation layer 90 covering the peripheral circuits. In other words, a bottom surface of the horizontal semiconductor layer 100 may be in contact with the lower filling insulation layer 90. The horizontal semiconductor layer 100 may include a cell array region CAR and a contact region CTR adjacent to the cell array region CAR.

The horizontal semiconductor layer 100 may be formed of a semiconductor material. For example, the horizontal semiconductor layer 100 may include silicon (Si), germanium (Ge), silicon-germanium (SiGe), gallium-arsenic (GaAs), indium-gallium-arsenic (InGaAs), aluminum-gallium-arsenic (AlGaAs), or any combination thereof. In addition, the horizontal semiconductor layer 100 may include a semiconductor doped with dopants of a first conductivity type and/or an intrinsic semiconductor not doped with dopants. The horizontal semiconductor layer 100 may have a crystal structure including at least one of a single-crystalline structure, an amorphous structure, or a poly-crystalline structure.

The stack structures ST may extend in parallel in a first direction D1 on the horizontal semiconductor layer 100 and may be spaced apart from each other in a second direction D2. Each of the stack structures ST may include electrodes EL vertically stacked on the horizontal semiconductor layer 100 and insulating layers ILD disposed between the electrodes EL. Thicknesses of the insulating layers ILD may be changed according to characteristics of the semiconductor memory device. In some exemplary implementations, the lowermost insulating layer ILD may be thinner than other insulating layers ILD. In some exemplary implementations, one or some of the insulating layers ILD may be thicker than other insulating layers ILD.

The stack structures ST may have stepwise structures for electrically connecting the electrodes EL to the peripheral logic structure PS, and the stepwise structures may be disposed in the contact region CTR. An upper filling insulation layer 200 may be disposed on the horizontal semiconductor layer 100 to cover end portions of the electrodes EL which have the stepwise structure. A capping insulating layer 205 may cover the stack structures ST and the upper filling insulating layer 200. Bit lines BL may be disposed on the capping insulating layer 205 and may extend in the second direction D2 to intersect the stack structures ST. The bit lines BL may be electrically connected to the vertical structures VS through bit line contact plugs BPLG.

The vertical structures VS may penetrate each of the stack structures ST so as to be connected to the horizontal semiconductor layer 100. In some exemplary implementations, the vertical structures VS may include a semiconductor material. Bottom surfaces of the vertical structures VS may be disposed at a level between a top surface and a bottom surface of the horizontal semiconductor layer 100. Contact pads may be disposed in top end portions of the vertical structures VS and may be connected to the bit line contact plugs BPLG.

A data storage layer DS may be disposed between the vertical structure VS and the stack structure ST. The data storage layer DS may include a vertical insulating pattern VP penetrating the stack structure ST and a horizontal pattern HP extending from between the electrode EL and the vertical insulating pattern VP onto top and bottom surfaces of the electrode EL, as described with reference to FIG. 19.

Common source regions CSR may be disposed in the horizontal semiconductor layer 100. Each of the common source regions CSR may be disposed in the horizontal semiconductor layer 100 between the stack structures adjacent to each other. The common source regions CSR may extend in the first direction D1 in parallel to the stack structures ST. The common source regions CSR may be formed by doping the horizontal semiconductor layer 100 with dopants of a second conductivity type. For example, the common source regions CSR may be doped with N-type dopants (e.g., arsenic (As) or phosphorus (P)).

A common source structure CSP may be connected to each of the common source region CSR, and sidewall insulating spacers SP may be disposed between the common source structure CSP and the stack structures ST. In some exemplary implementations, the common source structure CSP may extend in the first direction D1, and the sidewall insulating spacers SP may also extend in the first direction D1 between the common source structure CSP and the stack structures ST. In certain exemplary implementations, the sidewall insulating spacer SP may fill a space between the stack structures ST adjacent to each other, and the common source structure CSP may penetrate the sidewall insulating spacer SP so as to be locally connected to the common source region CSR. In some exemplary implementations, forming the common source structure CSP may include depositing a first tungsten layer covering inner surfaces of trenches, performing a surface treatment process on a portion of the first tungsten layer, and depositing a second tungsten layer completely filling the trenches on the first tungsten layer, as described with reference to FIGS. 19 to 22.

Pickup regions 10P may be disposed in the horizontal semiconductor layer 100 in the contact region CTR. The pickup regions 10P may be adjacent to both ends of each of the stack structures ST. In other words, the pickup regions 10P may be spaced apart from each other in the first direction D1. The pickup regions 10P may be formed by doping portions of the horizontal semiconductor layer 100 with dopants of the first conductivity type. In other words, the pickup regions 10P may have the same conductivity type as the horizontal semiconductor layer 100, and a dopant concentration of the pickup region 10P may be higher than that of the horizontal semiconductor layer 100.

An interconnection structure for electrically connecting the cell array structure CS to the peripheral logic structure PS may be disposed on the end portions of the stack structures ST constituting the stepwise structures. The interconnection structure may include contact plugs PLG and connection lines CL. The contact plugs PLG may penetrate the upper filling insulation layer 200 covering the end portions of the stack structures ST and may be connected to the end portions of the electrodes EL, respectively. The connection lines CL may be disposed on the upper filling insulation layer 200 so as to be connected to the contact plugs PLG. Vertical lengths of the contact plugs PLG may decrease stepwise as a distance from the cell array region decreases.

Pickup contact plugs PPLG may penetrate the upper filling insulation layer 200 so as to be connected to the pickup regions 10P, respectively. Top surfaces of the pickup contact plugs PPLG may be substantially coplanar with top surfaces of the contact plugs PLG. The pickup contact plug PPLG may be electrically connected to the peripheral logic structure PS through a well conductive line PCL and a connection plug CPLG.

The connection plug CPLG may electrically connect the cell array structure CS to the peripheral logic structure PS. The connection plug CPLG may penetrate the upper filling insulation layer 200 and the horizontal semiconductor layer 100 so as to be connected to the peripheral circuit interconnection ICL of the peripheral logic structure PS. An insulating spacer SSP may surround the connection plug CPLG to electrically insulate the connection plug CPLG from the horizontal semiconductor layer 100.

As shown in FIG. 35, a conductive layer may be formed to fill a through-hole that penetrates the upper filling insulation layer 200 and the horizontal semiconductor layer 100 to expose the peripheral circuit interconnection ICL, and then, a planarization process may be performed on the conductive layer to form the connection plug CPLG. Here, forming the conductive layer filling the through-hole may include sequentially depositing the barrier metal layer 31 and the first tungsten layer 41 covering an inner surface of the through-hole, performing the surface treatment process a portion of the first tungsten layer 41, and depositing the second tungsten layer completely filling the trenches on the first tungsten layer 41, as described with reference to FIGS. 2 to 4. In addition, the insulating spacer SSP may be formed in the through-hole to expose the peripheral circuit interconnection ICL before the formation of the conductive layer.

Before the deposition of the second tungsten layer 51, the first tungsten layer 41 may have the first surface S1 treated by the surface treatment process and the second surface S2 not treated by the surface treatment process. The grains of the second tungsten layer 51 deposited on the first surface S1 may be larger than the grains of the first tungsten layer 41. The grains of the second tungsten layer 51 may be laterally grown from the sidewalls of the recess region defined by the first tungsten layer 41, and thus, the second interface IF2 may be formed by the grains, coming in contact with each other, of the second tungsten layer 51 in a central region of the connection plug CPLG. The grains of the second tungsten layer 51 in an upper portion of the connection plug CPLG may be larger than the grains of the second tungsten layer 51 in a lower portion of the connection plug CPLG, as described with reference to FIGS. 8A and 8B.

Figure 36:
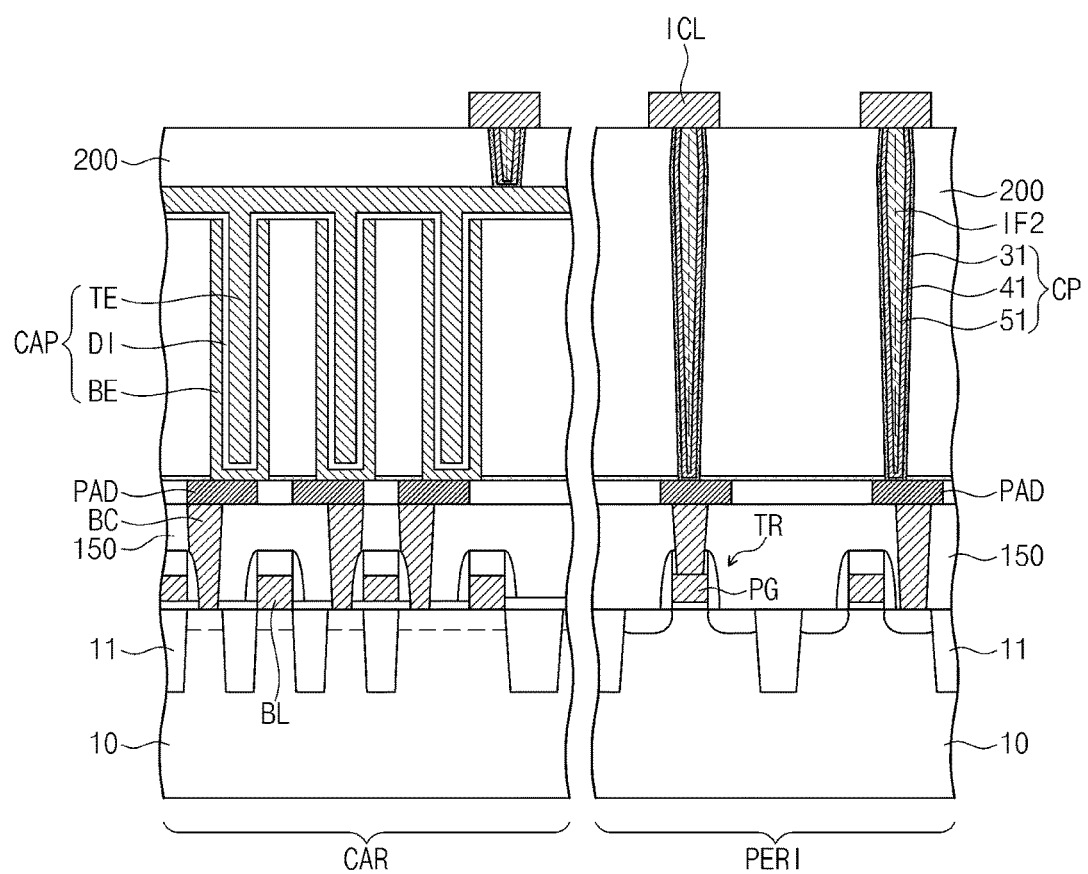
FIG. 36 is a cross-sectional view illustrating a semiconductor memory device according to some exemplary implementations of the disclosed subject matter.

FIG. 36 is a cross-sectional view illustrating a semiconductor memory device according to some exemplary implementations of the disclosed subject matter.

As shown in FIG. 36, a substrate 10 may include a cell array region CAR and a peripheral circuit region PERI. Memory cells may be formed in the cell array region CAR, and peripheral circuits controlling the memory cells may be formed in the peripheral circuit region PERI.

Each of the memory cells on the substrate 10 of the cell array region CAR may include a selection element and a data storage element. In some exemplary implementations, the selection element may be a MOS transistor or a diode. In some exemplary implementations, the data storage element may be a capacitor or a variable resistor. The peripheral circuits (NMOS and/or PMOS transistors, a diode, and/or a resistor) may be formed on the substrate 10 of the peripheral circuit region PERI.

In some exemplary implementations, word lines (not shown) and bit lines BL intersecting the word lines may be formed on the substrate 10 of the cell array region CAR, and the data storage elements may be respectively formed at crossing points of the word lines and the bit lines BL. In some exemplary implementations, the data storage element may include a capacitor CAP that includes a bottom electrode BE, a top electrode TE, and a dielectric layer DI between the bottom and top electrodes BE and TE.

The bit lines BL may be disposed on the substrate 10 of the cell array region CAR to intersect the word lines (not shown). The bit lines BL may be electrically connected to some source/drain regions. A lower filling insulation layer 150 may cover the bit lines BL, and contact plugs BC may be formed in the lower filling insulation layer 150. The contact plugs BC may electrically connect the data storage elements to other source/drain regions. Contact pads PAD may be formed on the contact plugs BC, respectively. The contact pad PAD may increase a contact area between the contact plug BC and the bottom electrode BE formed on the contact pad PAD.

The peripheral circuits, e.g., transistors TR, may be formed on the substrate 10 of the peripheral circuit region PERI. In detail, a device isolation layer 11 may be formed in the substrate 10 of the peripheral circuit region PERI to peripheral active regions, peripheral gate electrodes PG may be formed to cross over the peripheral active regions, and source/drain dopant regions may be formed in the peripheral active region at both sides of each of the peripheral gate electrodes PG. In addition, contact plugs may be formed to be connected to the source/drain regions and the peripheral gate electrodes PG.

The lower filling insulation layer 150 may cover the word lines (not shown) and the bit line BL of the cell array region CAR and the transistors TR of the peripheral circuit region PERI.

In the cell array region CAR, the bottom electrodes BE of the capacitors CAP may be formed on the contact pads PAD, respectively. After the formation of the bottom electrodes BE, the dielectric layer DI may be formed to conformally cover surfaces of the bottom electrodes BE. The top electrode TE may be formed on the dielectric layer DI. The bottom electrode BE may have a cylindrical shape or a pillar shape. The top electrode TE may be formed on the dielectric layer DI to cover a plurality of the bottom electrodes TE. In addition, the top electrode TE may fill inner spaces of the cylindrical bottom electrodes BE in which the dielectric layer DI is formed.

In some exemplary implementations, the capacitance of the capacitor CAP may be proportional to a surface area of the bottom electrode BE, and thus, a height of the bottom electrode BE may be increased to increase the surface area of the bottom electrode BE in a limited area. In other word, an aspect ratio (i.e., a ratio of the height to a width) of the bottom electrode BE may be increased as the capacitance of the capacitor CAP increases. Since the height of the bottom electrode BE is increased, an upper filling insulation layer 200 of the peripheral circuit region PERI may have a thickness that is equal to or greater than the height of the capacitor CAP. As a result, a peripheral contact plug CP electrically connected to the transistor TR of the peripheral circuit region PERI may have a high aspect ratio.

In some exemplary implementations, forming the peripheral contact plug CP may include forming a contact hole penetrating the upper filling insulation layer 200 to expose a portion of a contact pad PAD of the peripheral circuit region PERI, sequentially depositing the barrier metal layer 31 and the first tungsten layer 41 covering an inner surface of the contact hole, performing the surface treatment process on a portion of the first tungsten layer 41, and depositing the second tungsten layer 51 completely filling the contact hole on the first tungsten layer 41, as described with reference to FIGS. 1 to 11. Here, a height of the contact hole may be greater than the height of the capacitor. For example, the contact hole may have a high aspect ratio of about 5:1 to about 20:1. In some exemplary implementations, the contact hole may have a substantially circular shape when viewed from a plan view. In addition, the contact hole may include a bowing region in which a width is increased, as described with reference to FIG. 1.

The first tungsten layer 41 may have the first surface S1 treated by the surface treatment process and the second surface S2 not treated by the surface treatment process before depositing the second tungsten layer 51. The grains of the second tungsten layer 51 deposited on the first surface S1 may be larger than those of the first tungsten layer 41. The grains of the second tungsten layer 51 may be laterally grown from the sidewalls of the recess region defined by the first tungsten layer 41, and thus, the second interface IF2 may be formed by the grains, coming in contact with each other, of the second tungsten layer 51 in a central region of the peripheral contact plug CP. The grains of the second tungsten layer 51 in an upper portion of the peripheral contact plug CP may be larger than the grains of the second tungsten layer 51 in a lower portion of the peripheral contact plug CP, as described with reference to FIGS. 8A and 8B.

According to exemplary implementations of the disclosed subject matter, the connection structure may be formed by depositing the conductive material on the inner wall of the opening having a high aspect ratio. Here, the first tungsten layer may be deposited, and then the surface treatment process may be performed on a portion of the first tungsten layer deposited in the upper portion of the opening. Subsequently, the second tungsten layer may be deposited on the first tungsten layer to fill the opening. When the second tungsten layer is deposited, the growth rate of the tungsten grains in the upper region of the opening may be lower than that of the tungsten grains in the lower region of the opening. Thus, the opening having a high aspect ratio may be completely filled with the tungsten layer without a seam or void. As a result, a resistance of the connection structure having a high aspect ratio may be reduced to improve electrical reliability of the semiconductor device.

While the exemplary implementations of the disclosed subject matter have been described with reference to exemplary implementations, it will be apparent to those skilled in the art that various changes and modifications may be made without departing from the spirits and scopes of the exemplary implementations. Therefore, it should be understood that the above exemplary implementations are not limiting, but illustrative. Thus, the scopes of the exemplary implementations are to be determined by the broadest permissible interpretation of the following claims and their equivalents, and shall not be restricted or limited by the foregoing description.

What is claimed is:

1. A semiconductor device comprising:
a lower structure including a lower conductor;
an upper structure disposed on the lower structure, the upper structure having an opening exposing the lower conductor; and
a connection structure filling the opening, the connection structure connected to the lower conductor,
wherein the connection structure comprises:
a first tungsten layer including grains and covering an inner surface of the opening, the first tungsten layer defining a recess region in the opening; and
a second tungsten layer including grains and filling the recess region on the first tungsten layer,
wherein the mean grain size of the second tungsten layer in an upper portion of the connection structure is greater than the mean grain size of the second tungsten layer in a lower portion of the connection structure.

2. The semiconductor device of claim 1, wherein a mean grain size of the second tungsten layer is greater than a mean grain size of the first tungsten layer.

3. The semiconductor device of claim 1, wherein the connection structure includes: a first interface formed by grains of the first tungsten layer and grains of the second tungsten layer; and a second interface formed by grains of the second tungsten layer in a central region of the connection structure.

4. The semiconductor device of claim 3, wherein the connection structure has a linear shape extending in one direction, and
wherein the first and second interfaces extend in parallel to the connection structure.

5. The semiconductor device of claim 3, wherein a vertical length of the second interface is greater than a half of a vertical length of the connection structure.

6. The semiconductor device of claim 1, wherein a depth of the recess region is greater than a half of a depth of the opening.

7. The semiconductor device of claim 1, wherein a thickness of the first tungsten layer on a bottom surface of the opening is greater than a thickness of the first tungsten layer on a sidewall of the opening.

8. The semiconductor device of claim 1, wherein the connection structure includes a bowing region between a top surface and a bottom surface of the connection structure, and
wherein the connection structure has its maximum width in the bowing region.

9. The semiconductor device of claim 1, wherein the upper structure comprises: insulating layers and electrodes alternately stacked on the lower structure, and
wherein the connection structure further comprises: an insulating spacer disposed between the first tungsten layer and sidewalls of the electrodes and between the first tungsten layer and sidewalls of the insulating layers.

10. A semiconductor device comprising:
stack structures extending in one direction on a substrate, the stack structures spaced apart from each other, and each of the stack structures comprising a plurality of electrodes vertically stacked on the substrate;
a plurality of vertical structures penetrating each of the stack structures;
a common source line structure disposed between the stack structures adjacent to each other and spaced apart from the vertical structures, the common source line structure extending in parallel to the electrodes; and
insulating spacers disposed between the common source line structure and the stack structures,
wherein the common source line structure comprises:
a first tungsten layer including grains, covering the insulating spacers, and defining a recess region; and
a second tungsten layer including grains and filling the recess region on the first tungsten layer,
wherein the common source line structure includes an upper portion adjacent to an uppermost one of the electrodes and a lower portion adjacent to a lowermost one of the electrodes, and
the mean grain size of the second tungsten layer in the upper portion of the common source line structure is greater than the mean grain size of the second tungsten layer in the lower portion of the common source line structure.

11. The semiconductor device of claim 10, wherein a mean grain size of the second tungsten layer is greater than a mean grain size of the first tungsten layer.

12. The semiconductor device of claim 10, wherein the common source line structure includes: a first interface formed by grains of the first tungsten layer and grains of the second tungsten layer being in contact with the grains of the first tungsten layer; and a second interface formed by grains of the second tungsten layer in a central region of the common source line structure.

13. The semiconductor device of claim 12, wherein the first and second interfaces of the common source line structure extend in parallel to the stack structures along the one direction.

14. The semiconductor device of claim 10, wherein a vertical length of the second tungsten layer is greater than a half of a vertical length of each stack structure.

15. The semiconductor device of claim 10, wherein the common source line structure has its maximum width in a bowing region disposed between a top surface and a bottom surface of the common source line structure, and
wherein the bowing region is disposed at a higher level than a bottom surface of the uppermost one of the electrodes.

16. A semiconductor device comprising:
a semiconductor substrate having a plurality of conductor regions spaced apart from each other and extending into an upper surface of the semiconductor substrate;
an upper structure formed on the semiconductor substrate and on first portions of the plurality of conductor regions, the upper structure including openings there through which expose second portions of the plurality of conductor regions, wherein the openings are widest at a point between the upper surface and lower surface of the upper structure, and the width of the openings at an upper surface of the upper structure is wider than the width of the openings at a lower surface of the upper structure; and a layered filling structure that fills each of the openings and contacts each of the plurality of conductor regions, comprising:

a barrier metal layer uniformly covering sidewalls of the openings and the first portions of the plurality of conductor regions;

a first tungsten layer that non-uniformly covers the barrier metal layer and defines a recess region in each of the openings; and a second tungsten layer filling each of the recess regions defined in each of the openings.

17. The semiconductor device of claim 16, wherein opposite sidewall surfaces of the openings have, respectively, negative slope to positive slope and positive slope to negative slope sidewalls.

18. The semiconductor device of claim 16, wherein the layered filling structure includes: a first interface formed by grains of the first tungsten layer and grains of the second tungsten layer; and a second interface formed by grains of the second tungsten layer along centerlines of each of the openings.

19. The semiconductor device of claim 16, wherein a mean grain size of the second tungsten layer is greater than a mean grain size of the first tungsten layer.

20. The semiconductor device of claim 16, wherein a thickness of the first tungsten layer on a bottom surface of the opening is greater than a thickness of the first tungsten layer on a sidewall of the opening.

* * * * *